United States Patent
Kim et al.

(10) Patent No.: US 10,529,937 B2
(45) Date of Patent: Jan. 7, 2020

(54) METHOD OF MANUFACTURING ORGANIC SEMICONDUCTOR DEVICE

(71) Applicants: FOUNDATION OF SOONGSIL UNIVERSITY-INDUSTRY COOPERATION, Seoul (KR); INDUSTRY-UNIVERSITY COOPERATION FOUNDATION HANYANG UNIVERSITY, Seoul (KR)

(72) Inventors: Do Hwan Kim, Anyang-si (KR); Moon Sung Kang, Seoul (KR); Haejung Hwang, Seoul (KR); Han Wool Park, Seoul (KR); Ji Hye Shin, Seoul (KR)

(73) Assignees: FOUNDATION OF SOONGSIL UNIVERSITY-INDUSTRY COOPERATION, Seoul (KR); IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 15/578,483

(22) PCT Filed: Jun. 26, 2017

(86) PCT No.: PCT/KR2017/006734
§ 371 (c)(1),
(2) Date: Nov. 30, 2017

(87) PCT Pub. No.: WO2018/004219
PCT Pub. Date: Jan. 4, 2018

(65) Prior Publication Data
US 2018/0315938 A1    Nov. 1, 2018

(30) Foreign Application Priority Data

Jun. 27, 2016  (KR) .................. 10-2016-0079962
Jun. 30, 2016  (KR) .................. 10-2016-0082390
(Continued)

(51) Int. Cl.
*H01L 51/05*     (2006.01)
*C09D 5/24*      (2006.01)
(Continued)

(52) U.S. Cl.
CPC .......... *H01L 51/0566* (2013.01); *C09D 5/24* (2013.01); *C09D 7/63* (2018.01); *C09D 165/00* (2013.01);
(Continued)

(58) Field of Classification Search
CPC ............ H01L 51/0566; H01L 51/0028; H01L 51/0007; C09D 7/63; C09D 165/00
(Continued)

(56) References Cited

U.S. PATENT DOCUMENTS 6,433,359 B1   8/2002   Kelley et al.
6,833,180 B1   12/2004  Kodemura
(Continued)

FOREIGN PATENT DOCUMENTS

JP   2007-019121 A   1/2007
JP   2008-153354 A   7/2008
(Continued)

OTHER PUBLICATIONS

M. F. Calhoun "Electronic functionalization of the surface of organic semiconductors with self-assembled monolayers" Department of Physics and Astronomy, Rutgers University, Nov. 18, 2007, p. 84-89.
(Continued)

*Primary Examiner* — Bo Fan
(74) *Attorney, Agent, or Firm* — Sughrue Mion, PLLC

(57) ABSTRACT

According to embodiments of the present invention, a method of manufacturing an organic semiconductor device includes forming a first organic semiconductor layer on a substrate, and forming a self-assembled monolayer by providing a self-assembly precursor onto the first organic semiconductor layer. The first organic semiconductor layer has a reactive group on a top surface of the first organic semiconductor layer. The forming of the self-assembled monolayer includes forming a chemical bond between the self-assembly precursor and the reactive group of the first organic semiconductor layer.

8 Claims, 24 Drawing Sheets

(30) Foreign Application Priority Data

| Dec. 7, 2016 | (KR) | PCT/KR2016/014290 |
|---|---|---|
| Jan. 13, 2017 | (KR) | PCT/KR2017/000461 |
| Jun. 22, 2017 | (KR) | 10-2017-0079382 |

(51) Int. Cl.

| C09D 165/00 | (2006.01) |
|---|---|
| C09D 7/63 | (2018.01) |
| H01L 51/00 | (2006.01) |
| C08K 5/5455 | (2006.01) |
| C08K 5/54 | (2006.01) |

(52) U.S. Cl.

CPC ...... *H01L 51/0007* (2013.01); *H01L 51/0028* (2013.01); *H01L 51/0035* (2013.01); *H01L 51/0541* (2013.01); *H01L 51/0545* (2013.01); *C08G 2261/3223* (2013.01); *C08G 2261/3243* (2013.01); *C08G 2261/334* (2013.01); *C08G 2261/51* (2013.01); *C08G 2261/92* (2013.01); *C08K 5/5406* (2013.01); *C08K 5/5455* (2013.01); *H01L 51/0562* (2013.01)

(58) Field of Classification Search
USPC .......................................... 428/690; 430/322
See application file for complete search history.

(56) References Cited

U.S. PATENT DOCUMENTS

| 7,572,667 | B2 | 8/2009 | Ryu et al. |
|---|---|---|---|
| 7,800,101 | B2 | 9/2010 | Song et al. |
| 8,114,704 | B2 | 2/2012 | Kim et al. |
| 9,273,004 | B2* | 3/2016 | Afzali-Ardakani ......... C07D 213/76 |
| 2003/0175551 | A1* | 9/2003 | Smith ............ B82Y 10/00 428/690 |
| 2006/0231827 | A1 | 10/2006 | Hanato et al. |
| 2007/0042154 | A1* | 2/2007 | Hancer ............. G11B 5/8408 428/64.1 |
| 2010/0006824 | A1 | 1/2010 | Hong et al. |
| 2010/0264404 | A1 | 10/2010 | Myung-Seok et al. |
| 2011/0301276 | A1 | 12/2011 | Katayama et al. |
| 2013/0345370 | A1 | 12/2013 | Ona et al. |
| 2014/0183507 | A1 | 7/2014 | Benwadih |
| 2015/0144344 | A1* | 5/2015 | Mazyar ............... E21B 43/24 166/302 |
| 2016/0276590 | A1 | 9/2016 | Kim et al. |

FOREIGN PATENT DOCUMENTS

| KR | 2004-0029143 A | 4/2004 |
|---|---|---|
| KR | 10-0668615 B1 | 1/2007 |
| KR | 10-0708720 B1 | 4/2007 |
| KR | 10-0737293 B1 | 7/2007 |
| KR | 2010-0006294 A | 1/2010 |
| KR | 10-1174871 B1 | 8/2012 |
| KR | 2012-0095965 A | 8/2012 |
| KR | 10-1195550 B1 | 10/2012 |
| KR | 2013-0012823 A | 2/2013 |
| KR | 2014-0081249 A | 7/2014 |
| KR | 10-1508780 B1 | 4/2015 |
| KR | 2016-0055334 A | 5/2016 |
| KR | 10-1685071 B1 | 12/2016 |
| WO | WO-2008/090828 A1 | 7/2008 |

OTHER PUBLICATIONS

M. Constantinou et al. "Interface Passivation and Trap Reduction via a Solution-Based Method for Near-Zero Hysteresis Nanowire Field-Effect Transistors" ACS Appl. Mater. Interfaces 2015, 7, 22115-22120.

International Search Report PCT/ISA/210 for International Application No. PCT/KR2017/000461 dated Apr. 14, 2017.

Written Opinion of the International Searching Authority PCT/ISA/237 for International Application No. PCT/KR2017/000461 dated Apr. 14, 2017.

International Search Report PCT/ISA/210 for International Application No. PCT/KR2016/014290 dated Mar. 9, 2017.

Written Opinion of the International Searching Authority PCT/ISA/237 for International Application No. PCT/KR2016/014290 dated Mar. 9, 2017.

\* cited by examiner

METHOD OF MANUFACTURING ORGANIC SEMICONDUCTOR DEVICE

CROSS-REFERENCE TO RELATED APPLICATIONS

This application is a national phase under 35 U.S.C. § 371 of PCT International Application No. PCT/KR2017/006734 which has an International filing date of Jun. 26, 2017, which claims priority to Korean Patent Application No. 10-2017-0079382, filed Jun. 22, 2017, and further claims priority to PCT International Application No. PCT/KR2017/000461 filed Jan. 13, 2017, which claims priority to Korean Patent Application No. 10-2016-0082390 filed Jun. 30, 2016 and further claims priority to PCT/KR2016/014290 filed Dec. 7, 2016, which claims priority to Korean Patent Application No. 10-2016-0079962 filed Jun. 27, 2016, the entire contents of each of which are hereby incorporated by reference.

TECHNICAL FIELD

The present invention disclosed herein relates to a semiconductor device and, more particularly, to a method of manufacturing an organic semiconductor device.

BACKGROUND ART

The applications of flexible materials to display devices and/or thin-film solar cells have been actively studied. To manufacture these electronic devices, it may be advantageous to use an organic semiconductor instead of general an inorganic semiconductor. Thus, the organic semiconductor is very attractive in the electronic devices. An organic semiconductor device is a semiconductor device that uses an organic semiconductor material as a channel. However, since the organic semiconductor is sensitive to the external environment as compared with the inorganic semiconductor, there is a need for improving electrical characteristics and durability of the organic semiconductor device.

DISCLOSURE OF THE INVENTION

Technical Problem

The present invention provides an organic semiconductor device with improved durability and a method of manufacturing the same.

The present invention also provides a method of manufacturing an organic semiconductor device, which is capable of changing characteristics of a surface and a bulk (the inside) of an organic semiconductor layer.

Technical Solution

Embodiments of the present invention provide an organic semiconductor and a method of manufacturing the same. A method of manufacturing an organic semiconductor device may include forming a first organic semiconductor layer on a substrate, and forming a self-assembled monolayer by providing a self-assembly precursor onto the first organic semiconductor layer. The first organic semiconductor layer may have a reactive group on a top surface of the first organic semiconductor layer. The forming of the self-assembled monolayer may include forming a chemical bond between the self-assembly precursor and the reactive group of the first organic semiconductor layer.

In some embodiments, the self-assembled monolayer may have a functional group on a top surface of the self-assembled monolayer, and the functional group of the self-assembled monolayer may be different from the reactive group of the first organic semiconductor layer.

In some embodiments, the forming of the first organic semiconductor layer may include applying an organic semiconductor solution to a top surface of the substrate. The organic semiconductor solution may include an organic semiconductor material and an organometallic precursor. The organometallic precursor may be represented by the following chemical formula 1.

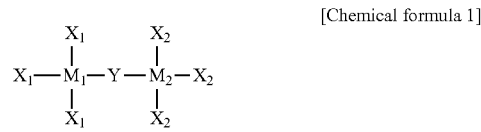

[Chemical formula 1]

In the chemical formula 1, "$M_1$" and "$M_2$" each independently include at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, or Uub. "Y" is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a silyl group. "$X_1$" and "$X_2$" are each independently selected from a group consisting of hydrogen, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group. The substituted alkyl group includes an alkyl group substituted with a halogen element.

In some embodiments, the organometallic precursor may include a plurality of organometallic precursors, and the forming of the first organic semiconductor layer may further include reacting the organometallic precursors with each other to form a network structure.

In some embodiments, the method may further include forming an insulating layer between the substrate and the first organic semiconductor layer. The insulating layer may have a functional group on a top surface of the insulating layer, and the forming of the first organic semiconductor layer may further include bonding the organometallic precursor to the functional group of the insulating layer.

In some embodiments, the method may further include forming a gate pattern between the substrate and the insulating layer, and forming a source/drain pattern on the first organic semiconductor layer.

In some embodiments, the method may further include forming an insulating layer on the self-assembled monolayer, forming a gate pattern on the insulating layer, and forming a source/drain pattern between the substrate and the first organic semiconductor layer.

In some embodiments, the self-assembly precursor may be represented by the following chemical formula 2.

[Chemical formula 2]

In the chemical formula 2, "A" includes one of —NH$_2$, —CH$_3$, —SH, —COOH, —CF$_3$, and a halogen element, the halogen element includes one of F, Cl, Br, and I. "R" is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 substituted or unsubstituted aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, a substituted or unsubstituted thiophene, an amino group, and a hydroxy group. "n" is an integral number between 0 and 30. "M$_3$" includes at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Jr, Lr, Rf, Db, Sg, Bh, Hs, Mt, Ds, Rg, or Uub. Groups represented by "X$_3$" are each independently selected from a group consisting of hydrogen, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group. The substituted alkyl group of "X$_3$" includes an alkyl group substituted with a halogen element.

In some embodiments, the chemical bond may include a silanol bond.

According to some embodiments of the inventive concept, a method of manufacturing an organic semiconductor device may include forming a preliminary organic semiconductor layer on a substrate, and providing self-assembly precursors onto the preliminary organic semiconductor layer to form a second organic semiconductor layer. The preliminary organic semiconductor layer may include an organic semiconductor material and organometallic precursors. The second organic semiconductor layer may include composites. The composites may be formed by reaction of the organometallic precursors and the self-assembly precursors. The composites may be dispersed in the second organic semiconductor layer.

In some embodiments, the method may further include thermally treating the second organic semiconductor layer to bond the organometallic precursors to each other.

In some embodiments, each of the organometallic precursors may be represented by the following chemical formula 1.

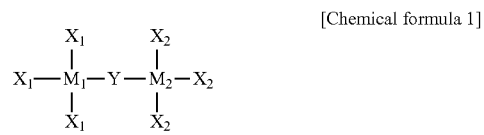

[Chemical formula 1]

In the chemical formula 1, "M$_1$" and "M$_2$" each independently include at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, or Uub. "Y" is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a silyl group. "X$_1$" and "X$_2$" are each independently selected from a group consisting of hydrogen, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group. The substituted alkyl group includes an alkyl group substituted with a halogen element.

In some embodiments, each of the self-assembly precursors may be represented by the following chemical formula 2.

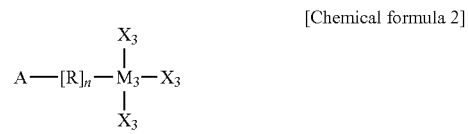

[Chemical formula 2]

In the chemical formula 2, "A" includes one of —NH$_2$, —CH$_3$, —SH, —COOH, —CF$_3$, and a halogen element, the halogen element includes one of F, Cl, Br, and I. "R" is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 substituted or unsubstituted aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, a substituted or unsubstituted thiophene, an amino group, and a hydroxy group. "n" is an integral number between 0 and 30. "$M_3$" includes at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, or Uub. Groups represented by "$X_3$" are each independently selected from a group consisting of hydrogen, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group. The substituted alkyl group of "$X_3$" includes an alkyl group substituted with a halogen element.

Advantageous Effects

According to some embodiments of the inventive concepts, the self-assembly precursor may react with the first reactive group of the organometallic precursor. The affinity for a material of the functional group of the self-assembly precursor may be different from the affinity for the material of the first reactive group of the organometallic precursor. Thus, various materials may be bonded to or interact with the functional group of the self-assembly precursor.

BRIEF DESCRIPTION OF THE DRAWINGS

The inventive concepts will become more apparent in view of the attached drawings and accompanying detailed description.

FIGS. 1A to 5A are cross-sectional views illustrating a method of manufacturing an organic semiconductor device according to some embodiments of the inventive concepts.

FIGS. 1B to 5B are enlarged views of regions 'B' of FIGS. 1A to 5A, respectively.

FIGS. 7A to 9A are cross-sectional views illustrating a method of manufacturing an organic semiconductor device according to some embodiments of the inventive concepts.

FIGS. 7B to 9B are enlarged views of regions 'B'' of FIGS. 7A to 9A, respectively.

BEST MODE FOR CARRYING OUT THE INVENTION

Figure 4A:
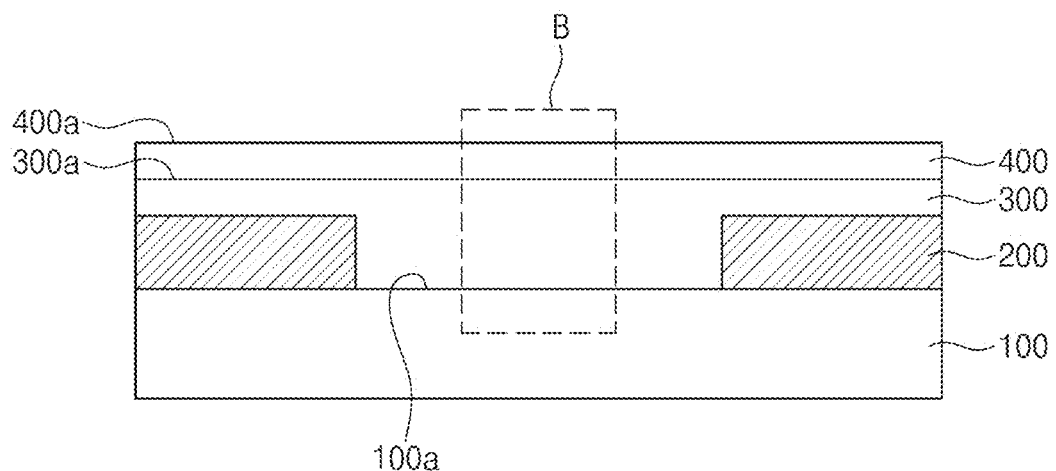
Figure 4B:
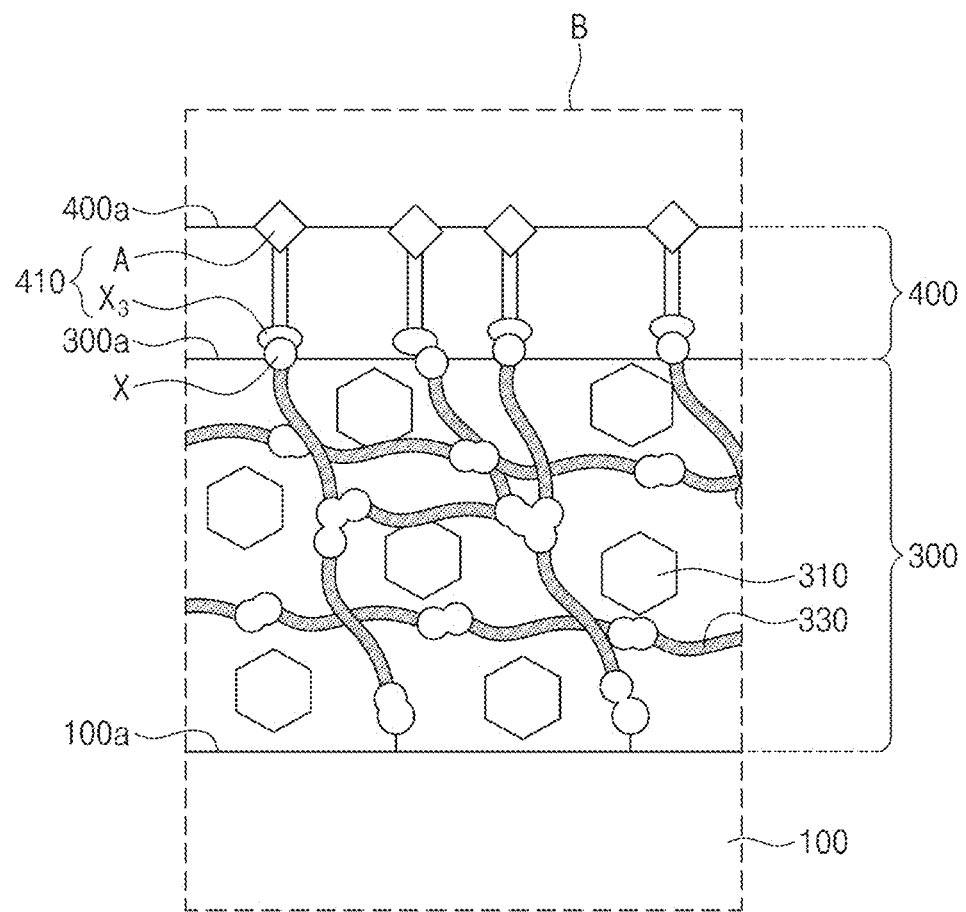

FIG. 4B illustrates the best mode for carrying out the present invention.

Mode for Carrying Out the Invention

Hereinafter, preferred embodiments of the present invention will be described in detail with reference to the accompanying drawings. Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

The terminology used herein is for the purpose of describing particular embodiments only and is not intended to be limiting of example embodiments. As used herein, the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

In the present specification, it will be understood that when a layer is referred to as being on another layer or substrate, it can be the layer directly formed on another layer or substrate or an intervening layer may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments. The use of similar or identical reference numbers in the various drawings is intended to indicate the presence of a similar or identical element or feature.

Unless otherwise defined, all terms (including technical and scientific terms) used herein have the same meaning as commonly understood by one of ordinary skill in the art to which example embodiments of the inventive concepts belong.

In the present specification, the number immediately after "C" may mean the number of carbon atom. For example, the term "C1" may mean that the number of a carbon atom is 1, and the term "C30" may mean that the number of carbon atoms is 30.

In the present specification, an alkyl group may be a straight chain alkyl group, a branched chain alkyl group, or a cycloalkyl group. A carbon number of the alkyl group may range from 1 to 30, from 1 to 20, or from 1 to 10. A 'substituted' or 'unsubstituted' component may mean a component that is substituted with one or more substituents or is not substituted. A silyl group includes an alkyl silyl group and/or an aryl silyl group. An alkenyl group may be a straight chain alkenyl group or a branched chain alkenyl group. An amino group may include an unsubstituted amino group, a C1 to C30 alkyl amino group, and/or a C1 to C30 aryl amino group. The silyl group may include an unsubstituted silyl group, a C1 to C30 alkyl substituted silyl group, and/or a C3 to C30 aryl substituted silyl group. A heteroaryl group may include at least one selected from a group consisting of O, N, P, Si, and S which correspond to hetero atoms. When the heteroaryl group includes two or more hetero atoms, the two or more hetero atoms may be the same as each other or may be different from each other. The heteroaryl group may be a monocyclic heteroaryl group or a polycyclic heteroaryl group. A halogen element may include one of F, Cl, Br, and I.

Organic semiconductor devices and methods of manufacturing the same according to some embodiments of the inventive concepts will be described hereinafter.

FIGS. 1A to 5A are cross-sectional views illustrating a method of manufacturing an organic semiconductor device according to some embodiments of the inventive concepts. FIGS. 1B to 5B are enlarged views of regions 'B' of FIGS. 1A to 5A, respectively.

Figure 1A:
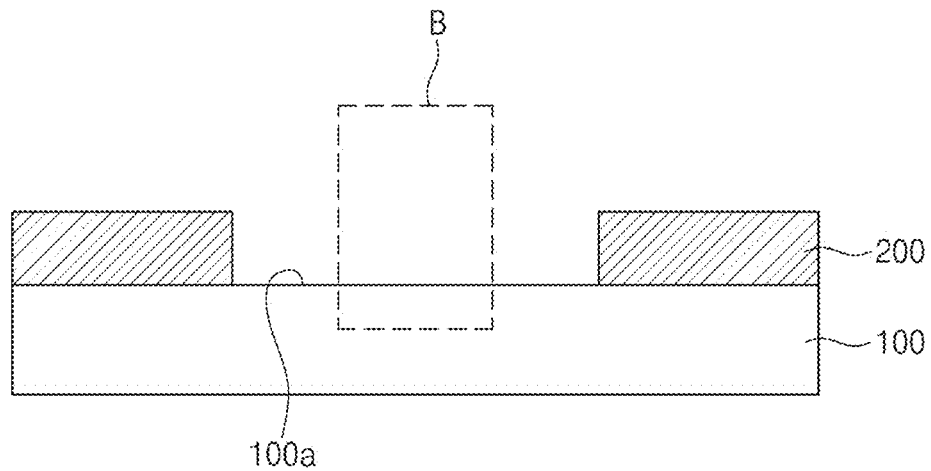
Figure 1B:
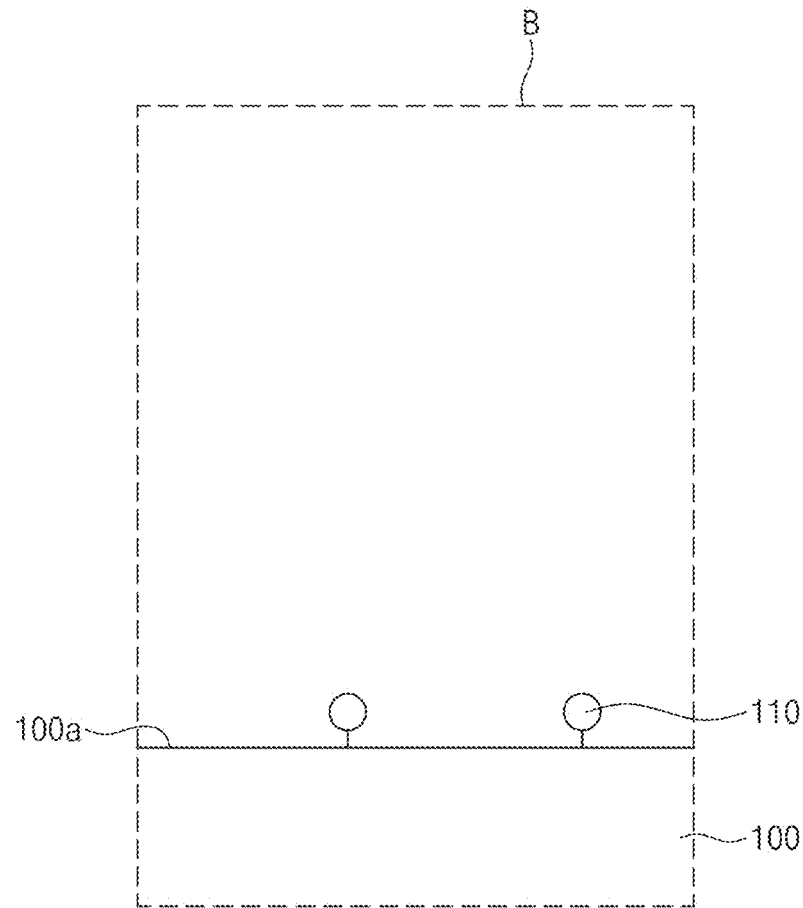

Referring to FIGS. 1A and 1B, source/drain patterns 200 may be formed on a substrate 100. The substrate 100 may include an insulating material. In some embodiments, the substrate 100 may include an inorganic material such as silicon or glass. In other embodiments, the substrate 100 may include an organic material such as plastic or polymer. The substrate 100 may have functional groups 110 disposed on a top surface 100a of the substrate 100. The functional group 110 of the substrate 100 may include at least one of a silanol group, a carboxyl group, a C1 to C30 alkoxycarbonyl group, a C3 to C30 aryloxycarbonyl group, or a hydroxy group. The source/drain patterns 200 may include a conductive material. For example, the source/drain patterns 200 may include at least one of a metal, doped poly-silicon, a conductive polymer, or a conductive carbon material. The conductive carbon material may include graphene. The source/drain patterns 200 may expose the top surface 100a of the substrate 100.

In some embodiments, the functional groups 110 of the substrate 100 may be covered by impurities (not shown). The impurities may include, but not limited to, a carbon containing material. A cleaning process may be performed on the top surface 100a of the substrate 100. The cleaning process may be performed by an oxygen plasma treatment or a plasma treatment using ozone and ultraviolet. The impurities may be removed by the cleaning process, and thus the functional groups 110 of the substrate 100 may be exposed.

Figure 2A:
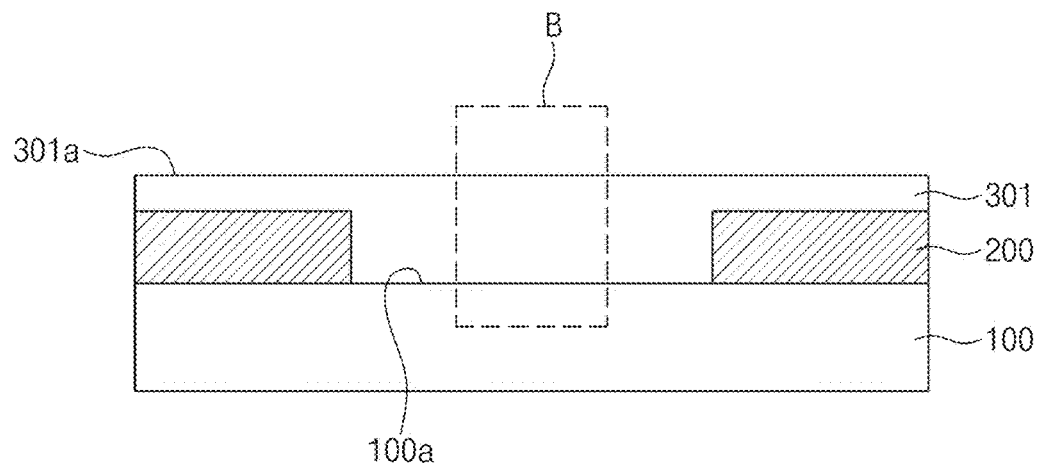
Figure 2B:
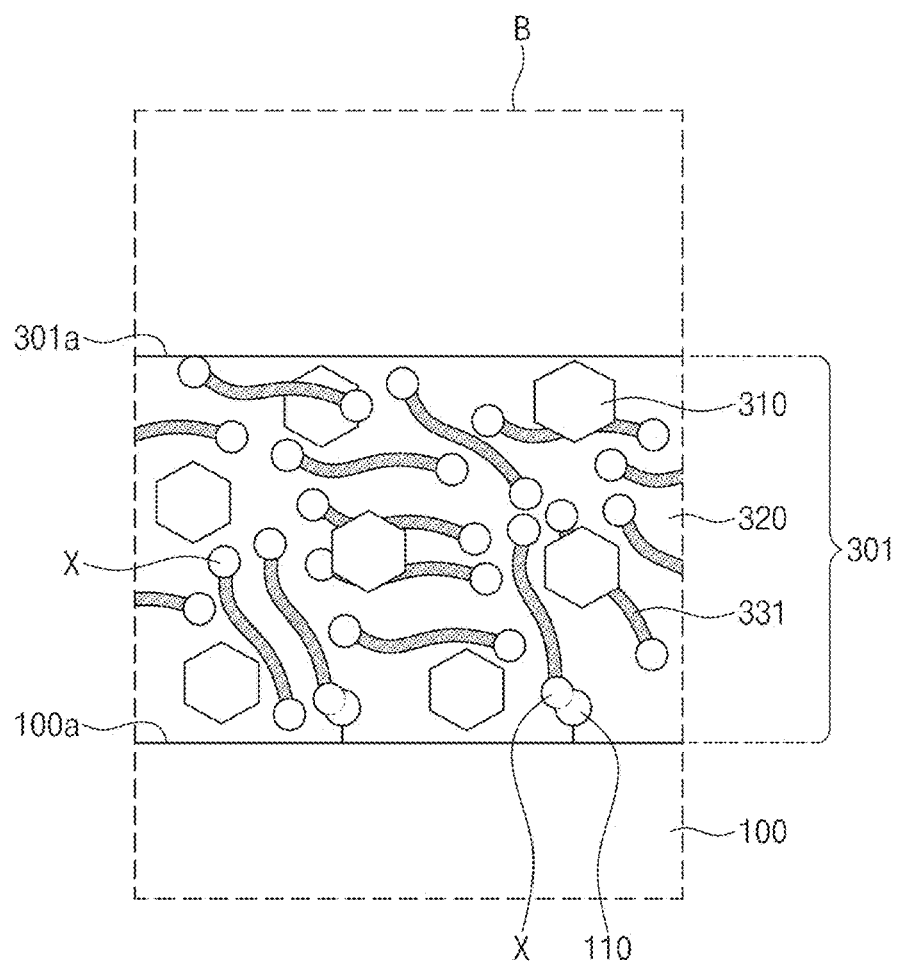
Figure 3A:
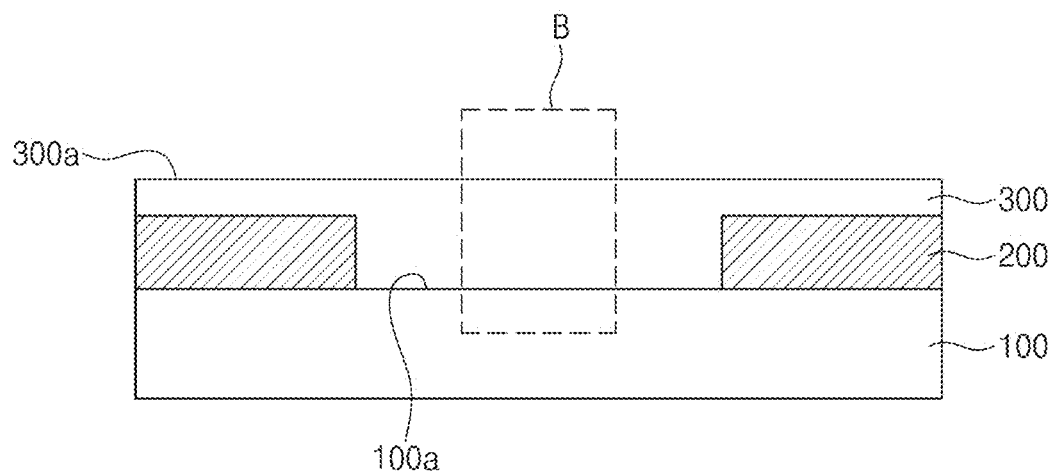
Figure 3B:
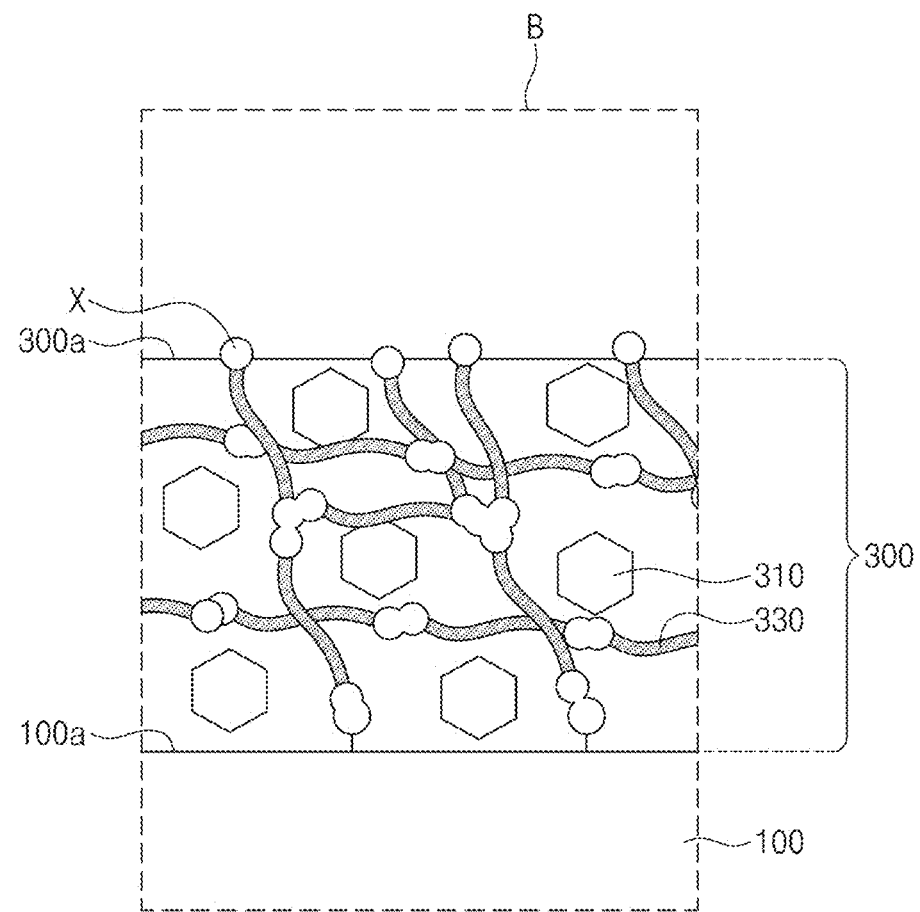

Referring to FIGS. 2A and 2B, a preliminary organic semiconductor layer 301 may be formed on the substrate 100 to cover the source/drain patterns 200. The preliminary organic semiconductor layer 301 may include an organic semiconductor material 310, an organometallic precursor 331, and an organic solvent 320. The organic semiconductor material 310 and the organometallic precursor 331 may be provided in the organic solvent 320. The organic semiconductor may mean an organic compound having semiconductor properties. An organic compound having a pi-conjugation structure may function as the organic semiconductor. The pi-conjugation structure may be formed in an organic compound in which multiple bonds and single bonds are alternately disposed. The pi-conjugation structure may mean a structure in which electrons are delocalized in p-orbitals of the organic compound. The organic compound may include carbon and hydrogen. In certain embodiments, the organic compound may further include a hetero atom. The hetero atom may include at least one of nitrogen, sulfur, or oxygen.

The organic semiconductor material 310 may mean the organic semiconductor having the semiconductor properties described above. In some embodiments, the organic semiconductor material 310 may include at least one of polyacetylene, polypyrrole, polyaniline, polythiophene (PTh), poly(p-phenylenevinylene (PPV)), or any derivative thereof. In certain embodiments, the organic semiconductor material 310 may include at least one of a polythiophene-based material, a polypyrrole-based material, a poly(p-phenylenevinylene)-based material, a polyaniline-based material, a polyacetylene-based material, a polydiacetylene-based material, a polycarbazole-based material, a polyfuran-based material, a polyheteroaryl-based material, a nitrogen-containing aromatic compound, a condensed polycyclic aromatic compound, an aromatic amine derivative, a biscarbazol derivative, a piyrazoline derivative, a stilbene-based compound, a hydrazone-based compound, a metal phthalocyanine-based material, a metal porphyrin-based material, a condensed ring, or an organic pigment. Here, the polythiophene-based material may include poly-3-hexylthiophene or polybenzothiophene. The poly(p-phenylenevinylene)-based material may include poly(p-phenylenevinylene). The polyfuran-based material may include polyfuran or polybenzofuran. The polyheteroaryl-based material may use a nitrogen-containing aromatic ring as a constituent unit. The polyheteroaryl-based material may include, for example, pyridine, quinoline, phenanthrolin, oxazole, or oxadiazole. The condensed polycyclic aromatic compound may include anthracene, pyrene, naphthacene, pentacene, hexacene, or rubrene. The nitrogen-containing aromatic compound may include furan, thiophene, benzothiophene, dibenzofuran, pyridine, quinoline, phenanthrolin, oxazole, or oxadiazole. The aromatic amine derivative may include 4,4'-bis(N-(3-methylphenyl)-N-phenylamino)biphenyl. The biscarbazol derivative may include bis(N-allylcarbazol) or bis(N-alkylcarbazol). The metal phthalocyanine-based material may include copper phthalocyanine. The metal porphyrin-based material may include copper porphyrin. The condensed ring may include a distyrylbenzene derivative, an aminostyryl derivative, an aromatic acetylene derivative, naphthalene-1,4,5,8-tetracarboxylic diimide, or perylene-3,4,9,10-tetracarboxylic diimide. The organic pigment may include a tetracarboxylic diimide-based compound, merocyanine, phenoxazine, or rhodamine. However, the organic semiconductor material 310 is not limited thereto. In certain embodiments, the organic semiconductor material 310 may include at least one of other various materials.

The organometallic precursor 331 may be represented by the following chemical formula 1.

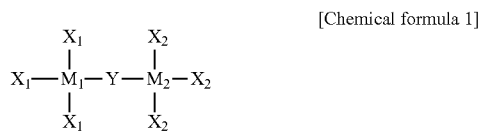

[Chemical formula 1]

In the chemical formula 1, "M1" and "M2" may be independent of each other, and each of "M1" and "M2" may include at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, or Uub.

"Y" may be one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a silyl group.

"X1" and "X2" may each be independently selected from a group consisting of hydrogen, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group. The substituted alkyl group may include an alkyl group substituted with a halogen element.

According to some embodiments, in the chemical formula 1, at least one of "X1" or "X2" may be one of a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group. In other embodiments, in the chemical formula 1, at least one of groups represented by "X1" and at least one of groups represented by "X2" may each be independently selected from a group consisting of a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a substituted C1 to C30 alkyl group, a carbamoyl group, an amino group, and a hydroxy group.

The organometallic precursor 331 may include a first reactive group X bonded to an inorganic element. The inorganic element may be represented as "M1" and "M2" in the chemical formula 1. The first reactive group X may be at least one of groups represented by "X1" and "X2" in the chemical formula 1. The first reactive group X may include at least one of a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a substituted C1 to C30 alkyl group, an amino group, or a hydroxy group.

The organic solvent 320 may include at least one of chloroform, dichloromethane, acetone, pyridine, tetrahydrofuran, chlorobenzene, dichlorobenzene, xylene, trichlorobenzene, toluene, or any mixture thereof.

In some embodiments, the organic semiconductor material 310, the organic solvent 320, and the organometallic precursor 331 may be mixed with each other to prepare an organic semiconductor solution. The organic semiconductor solution may be applied to a top surface of the substrate 100 to form the preliminary organic semiconductor layer 301. In some embodiments, the organic semiconductor solution may be applied by a spin coating method, a spray coating method, an ink-jet printing method, a dip coating method, a drop casting method, or a bar coating method. As illustrated in FIG. 2A, the preliminary organic semiconductor layer 301 may cover the source/drain patterns 200 and the substrate 100. As illustrated in FIG. 2B, the first reactive group X of the organometallic precursor 331 may react with the functional group 110 of the substrate 100. The reaction between the first reactive group X of the organometallic precursor 331 and the functional group 110 of the substrate 100 may include a condensation reaction. Thus, a chemical bond (e.g., a covalent bond) may be generated between the preliminary organic semiconductor layer 301 and the substrate 100. In some embodiments, the first reactive group X of the organometallic precursor 331 and the functional group 110 of the substrate 100 may be silanol groups. In this case, a siloxane bond may be formed between the preliminary organic semiconductor layer 301 and the substrate 100.

If the impurities (not shown) are provided on the functional group 110, it may be difficult for the organometallic precursor 331 to react with the functional group 110 of the substrate 100. In this case, bonding strength between the substrate 100 and the preliminary organic semiconductor layer 301 may be reduced. According to some embodiments of the inventive concepts, the impurities may be removed by the cleaning process described with reference to FIGS. 2A and 2B, thereby increasing or improving the bonding strength between the substrate 100 and the preliminary organic semiconductor layer 301.

The first reactive group X of the organometallic precursor 331 may act as a dopant of the organic semiconductor material 310. In the preliminary organic semiconductor layer 301, a content of the first reactive group X of the organometallic precursor 331 may be much greater than a content of the organic semiconductor material 310. The preliminary organic semiconductor layer 301 may have conductivity.

The organometallic precursor 331 may include a plurality of organometallic precursors 331. The organometallic precursors 331 may be dispersed in the preliminary organic semiconductor layer 301. The first reactive groups X of the organometallic precursors 331 may be provided at the top surface 301a of the preliminary organic semiconductor layer 301 and in the preliminary organic semiconductor layer 301.

Referring to FIGS. 2A, 2B, 3A, and 3B, the preliminary organic semiconductor layer 301 may be annealed to form a first organic semiconductor layer 300. The annealing of the preliminary organic semiconductor layer 301 may be performed by thermally treating the preliminary organic semiconductor layer 301 at a temperature of 50 degrees Celsius to 300 degrees Celsius. If the preliminary organic semiconductor layer 301 is thermally treated at a temperature higher than 300 degrees Celsius, the first organic semiconductor layer 300 may be damaged. The preliminary organic semiconductor layer 301 may gelate by the annealing process. The organic solvent 320 may be removed during the annealing process. In the annealing process, the first reactive groups X of the organometallic precursors 331 may react with each other. The reaction of the organometallic precursors 331 may include a hydrolysis reaction or a condensation reaction. Thus, the organometallic precursors 331 may be bonded (e.g., cross-linked) to each other, thereby forming a network structure 330 of FIG. 3B.

The first organic semiconductor layer 300 may include the network structure 330 and the organic semiconductor material 310. The network structure 330 may have, but not limited to, a ladder shape. The network structure 330 may be bonded to the substrate 100. End portions of the network structure 330 may be exposed at a top surface 300a of the first organic semiconductor layer 300 and may include first reactive groups X. The first reactive groups X of the network structure 330 may result from the first reactive groups X of the organometallic precursors 331. Hereinafter, first reactive groups X of the first organic semiconductor layer 300 may mean the first reactive groups X of the network structure 330. Chemical resistance and durability of the first organic semiconductor layer 300 may be improved by the network structure 330. The organic semiconductor material 310 may be dispersed in the network structure 330. The organic semiconductor material 310 may not be chemically bonded to the network structure 330. The organic semiconductor material 310 may be in physical contact with the network structure 330.

In some embodiments, the first reactive groups X may be bonded to each other to form the network structure 330. A content of the first reactive groups X in the first organic semiconductor layer 300 may be less than the content of the first reactive groups X in the preliminary organic semiconductor layer 301. For example, the first reactive groups X may be provided on the top surface 300a of the first organic semiconductor layer 300 but may not be provided in the first organic semiconductor layer 300.

If the functional groups 110 (see FIG. 1B) of the substrate 100 remain, the remaining functional groups 110 may act as electron/hole traps. According to some embodiments of the inventive concepts, the functional groups 110 of the substrate 100 may be removed to improve electrical characteristics of the first organic semiconductor layer 300.

Referring to FIGS. 4A and 4B, self-assembly precursors 410 may be applied to the top surface 300a of the first organic semiconductor layer 300 to form a self-assembled monolayer 400. The self-assembly precursor 410 may be represented by the following chemical formula 2.

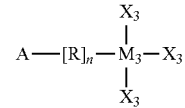

[Chemical formula 2]

In the chemical formula 2, "A" may include one of —NH2, —CH3, —SH, —COOH, —CF3, and a halogen element. A halogen element may include one of F, Cl, Br, and I.

"R" may be one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 substituted or unsubstituted aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, a substituted or unsubstituted thiophene, an amino group, and a hydroxy group. The substituted alkyl group may include an alkyl group substituted with a halogen element.

"n" may be an integral number between 0 and 30. "M3" may include at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Jr, Lr, Rf, Db, Sg, Bh, Hs, Mt, Ds, Rg, or Uub.

Groups represented by "X3" may each be independently selected from a group consisting of hydrogen, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group. The substituted alkyl group of X3 may include an alkyl group substituted with a halogen element.

According to some embodiments, in the chemical formula 2, at least one of the groups represented by "X3" may be one of a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group.

For example, the self-assembly precursor 410 may be selected from a group consisting of octyltrichlorosilane (OTS), octyltrimethoxysilane (OTMS), octyltriethoxysilane (OTES), hexamethyldisilazane (HMDS), octadecyltrichlorosilane (ODTS), octadecyltrimethoxysilane (OTMS), octadecyltriethoxysilane (OTE), (3-aminopropyl)trichlorosilane, (3-aminopropyl)trimethoxysilane (APTMS), (3-Aminopropyl)triethoxysilane (APTES), fluoroalkyl trichlorosilane (FTS), perfluorodecyltrichlorosilane (PFTS), perfluorodecyltrimethoxysilane (PFMS), perfluorodecyltriethoxysilane (PFES), mercaptopropyltrichlorosilane (MPTCS), mercaptopropyltrimethoxysilane (MPTMS), mercaptopropyltriethoxysilane (MPTES), (heptadecafluoro-1,1,2,2 tetrahydrodecyl)trichlorosilane (FDTS), (heptadecafluoro-1,1,2,2-tetrahydrodecyl)trimethoxysilane (FDMS), (heptadecafluoro-1,1,2,2-tetrahydrodecyl)triethoxysilane (FDES), 1H,1H,2H,2H-perfluorodecyltrichlorosilane (FOTS), 1H,1H,2H,2H-perfluorodecyltrimethoxysilane (FOMS), 1H,1H,2H,2H-perfluorodecyltriethoxysilane (FOES), dichlorodimethylsilane (DDMS), trichloromethylsilane (TCMS), 3-aminopropyl (triethoxysilane) (APS), trimethoxysilylpropyldiethylenetriamine (DETA), N-(2-aminoethyl)-3-aminopropyltrimethoxysilane (EDA), and any combination thereof. As illustrated in FIG. 4B, the self-assembly precursor 410 may include a second reactive group X3 and a functional group A. The second reactive group X3 of the self-assembly precursor 410 may be at least one of the groups represented by "X3" in the chemical formula 2. The second reactive group X3 may be one of a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group. The functional group A of the self-assembly precursor 410 may be represented by "A" in the chemical formula 2.

The second reactive group X3 of the self-assembly precursor 410 may react with one of the first reactive groups X of the first organic semiconductor layer 300. Thus, the self-assembled monolayer 400 may be chemically bonded to the first organic semiconductor layer 300. The chemical bond between the self-assembled monolayer 400 and the first organic semiconductor layer 300 may include a covalent bond (e.g., a silanol bond). The functional group A of the self-assembly precursor 410 may not react with the first reactive groups X of the first organic semiconductor layer 300. Thus, the self-assembled monolayer 400 may have the functional group A. The functional group A of the self-assembled monolayer 400 may originate from the functional group A of the self-assembly precursor 410. The functional group A of the self-assembled monolayer 400 may be provided on a top surface 400a of the self-assembled monolayer 400. The top surface 400a of the self-assembled monolayer 400 may be opposite to the first organic semiconductor layer 300. A kind of the functional group A of the self-assembled monolayer 400 may be different from a kind of the first reactive groups X of the first organic semiconductor layer 300. An affinity of the self-assembled monolayer 400 for a specific material may be different from an affinity of the first organic semiconductor layer 300 for the material. Here, the affinity of the self-assembled monolayer 400 may mean an affinity of the functional group A of the self-assembled monolayer 400, and the affinity of the first organic semiconductor layer 300 may mean an affinity of the first reactive groups X of the first organic semiconductor layer 300. In the present specification, an affinity may mean an ability that can react or interact with a material.

Figure 5A:
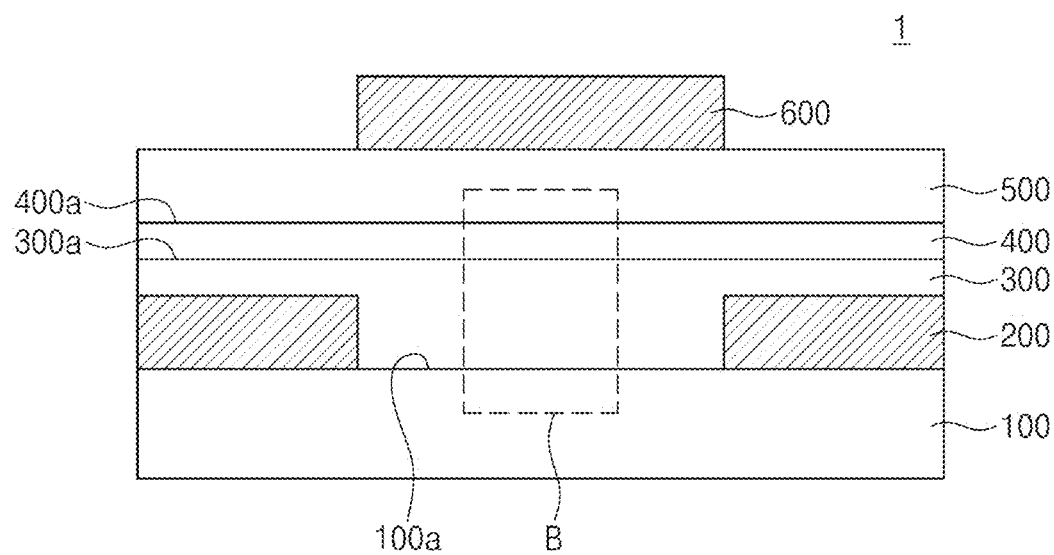
Figure 5B:
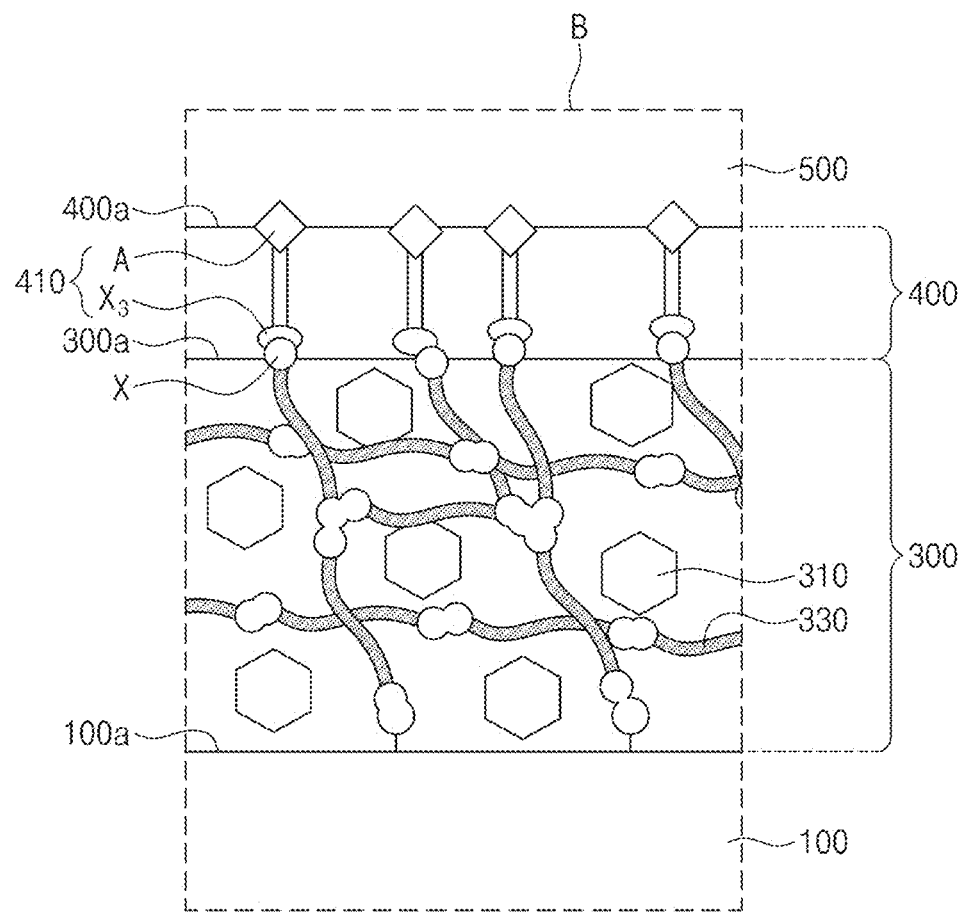

Referring to FIGS. 5A and 5B, an insulating layer 500 may be formed on the top surface 400a of the self-assembled monolayer 400. The insulating layer 500 may include an inorganic insulating material such as silicon oxide. In certain embodiments, the insulating layer 500 may include an organic insulating material. The organic insulating material may include at least one of polyvinyl alcohol (PVA), polyvinyl phenol (PVP), polymethyl methacrylate (PMMA), or polyimide (PI). The insulating layer 500 may have a functional group.

Bonding strength between the insulating layer 500 and the self-assembled monolayer 400 may be determined by the affinity of the functional group of the insulating layer 500 and the affinity of the self-assembled monolayer 400. The affinity of the self-assembled monolayer 400 for the insulating layer 500 may be greater than the affinity of the first organic semiconductor layer 300 for the insulating layer 500. Durability of the organic semiconductor device 1 may be improved by the improvement of the bonding strength between the insulating layer 500 and the self-assembled monolayer 400. The insulating layer 500 may be easily formed on the top surface 400a of the self-assembled monolayer 400 by the improvement of the bonding strength therebetween.

In some embodiments, since the self-assembled monolayer 400 is formed on the first organic semiconductor layer 300, electrical characteristics of the organic semiconductor device 1 may be further improved due to characteristics of the self-assembled monolayer 400.

A gate pattern 600 may be formed on the insulating layer 500. The gate pattern 600 may include a conductive material. For example, the gate pattern 600 may include at least one of a metal, doped poly-silicon, a conductive polymer, or a conductive carbon material. The organic semiconductor device 1 may be manufactured by the manufacturing processes described above.

Figure 6:
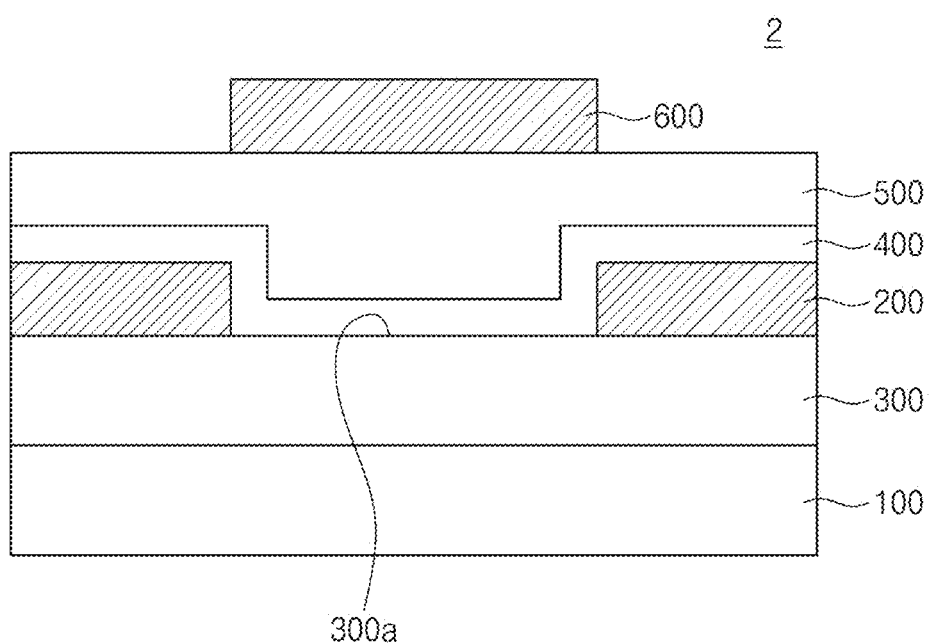
FIG. 6 is a cross-sectional view illustrating an organic semiconductor device according to some embodiments of the inventive concepts.

FIG. 6 is a cross-sectional view illustrating an organic semiconductor device according to some embodiments of the inventive concepts. Hereinafter, the descriptions to the same technical features as in the above embodiments will be omitted or mentioned briefly for the purpose of ease and convenience in explanation.

Referring to FIGS. 6 and 5B, an organic semiconductor device 2 may include a substrate 100, a first organic semiconductor layer 300, source/drain patterns 200, a self-assembled monolayer 400, an insulating layer 500, and a gate pattern 600. The substrate 100, the gate pattern 600, the first organic semiconductor layer 300, the self-assembled monolayer 400, and the source/drain patterns 200 and the method of forming the same may be substantially the same as described with reference to FIGS. 1A to 5A and 1B to 5B. However, in the present embodiment, the first organic semiconductor layer 300 may be formed before the formation of the source/drain patterns 200. The source/drain patterns 200 may be disposed on the top surface 300a of the first organic semiconductor layer 300. The source/drain patterns 200 may expose a portion of the top surface 300a of the first organic semiconductor layer 300. The self-assembled monolayer 400 may cover the exposed top surface 300a of the first organic semiconductor layer 300. The self-assembled monolayer 400 may extend onto the source/drain patterns 200. However, embodiments of the inventive concepts are not limited thereto.

FIGS. 7A to 9A are cross-sectional views illustrating a method of manufacturing an organic semiconductor device according to some embodiments of the inventive concepts. FIGS. 7B to 9B are enlarged views of regions 'B" of FIGS. 7A to 9A, respectively. Hereinafter, the descriptions to the same technical features as in the above embodiments will be omitted or mentioned briefly for the purpose of ease and convenience in explanation.

Figure 7A:
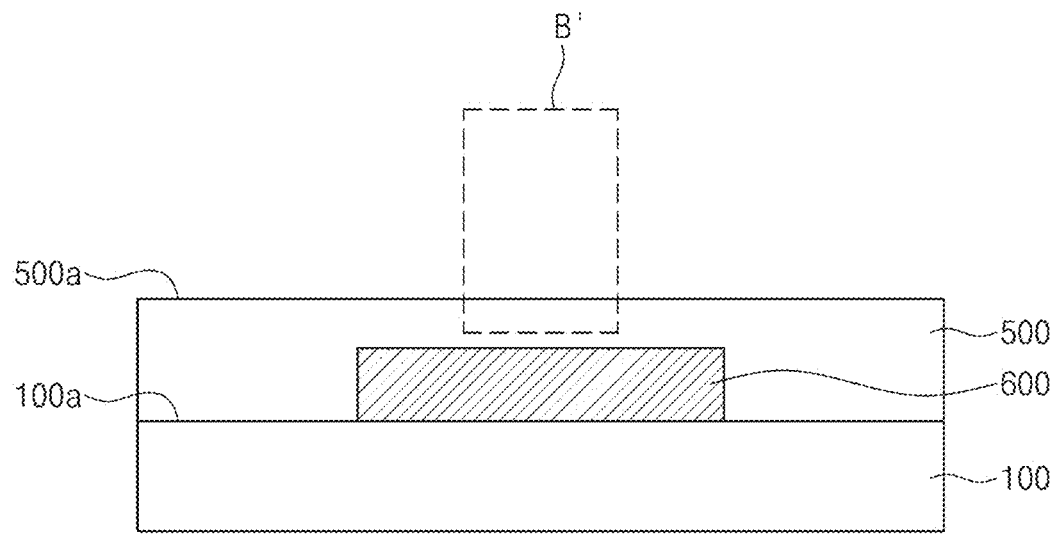
Figure 7B:
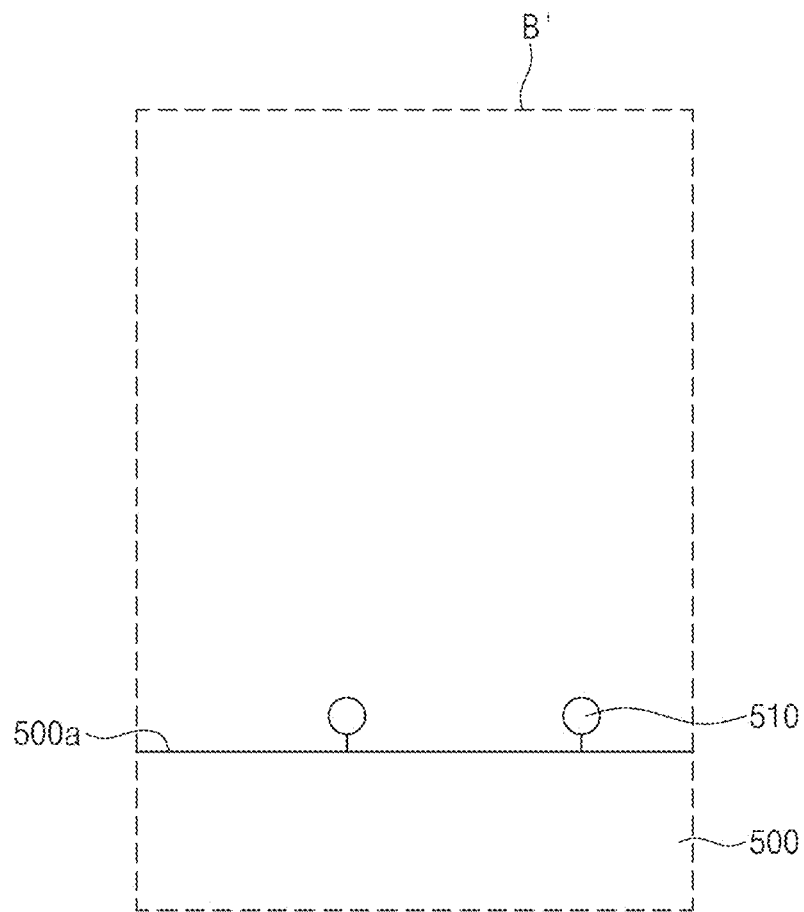

Referring to FIGS. 7A and 7B, a gate pattern 600 and an insulating layer 500 may be formed on a substrate 100. The gate pattern 600 may include a conductive material. The insulating layer 500 may be formed on the substrate 100 to cover the gate pattern 600. The insulating layer 500 may include the inorganic insulating material or the organic insulating material, described with reference to FIGS. 5A and 5B. The insulating layer 500 may have a functional group 510 disposed on a top surface 500a thereof. The functional group 510 of the insulating layer 500 may include at least one of a silanol group, a carboxyl group, a C1 to C30 alkoxycarbonyl group, a C3 to C30 aryloxycarbonyl group, or a hydroxy group. A cleaning process may be performed on the top surface 500a of the insulating layer 500. Impurities on the insulating layer 500 may be removed by the cleaning process, and thus the functional group 510 of the insulating layer 500 may be exposed.

Figure 8A:
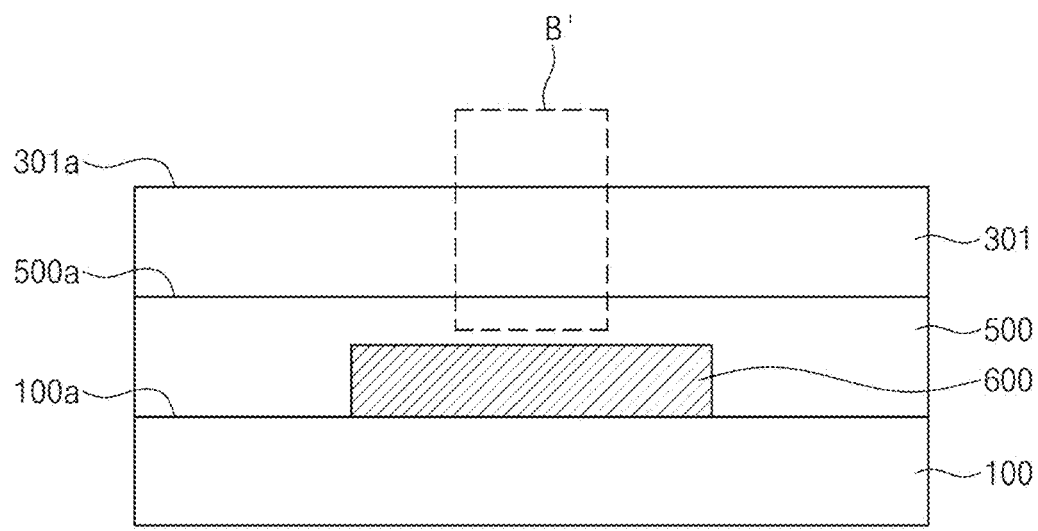
Figure 8B:
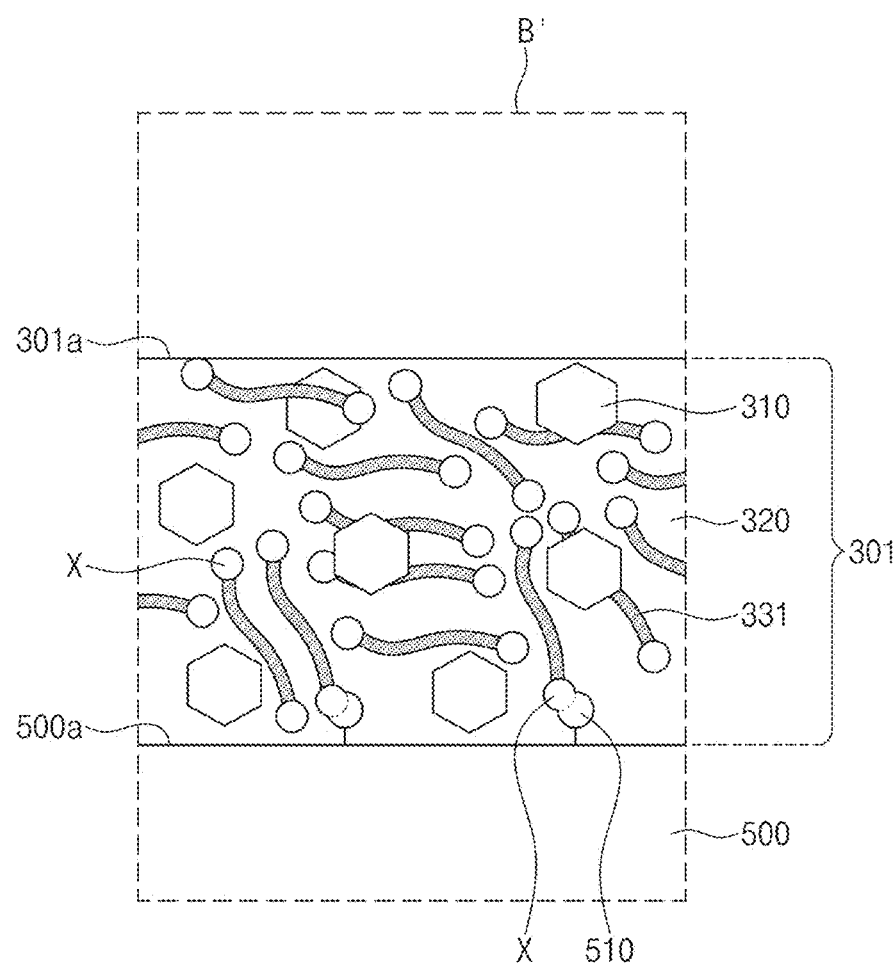

Referring to FIGS. 8A and 8B, an organic semiconductor solution may be applied to the top surface 500a of the insulating layer 500 to form a preliminary organic semiconductor layer 301. The preliminary organic semiconductor layer 301 may include an organic semiconductor material 310, an organic solvent 320, and organometallic precursors 331. The formation of the preliminary organic semiconductor layer 301 may be performed by the same method as described to form the preliminary organic semiconductor layer 301 of FIGS. 2A and 2B.

At least one of the first reactive groups X of the organometallic precursor 331 may react (e.g., condensation reaction) with the functional group 510 of the insulating layer 500. A chemical bond may be formed between the preliminary organic semiconductor layer 301 and the insulating layer 500. Bonding strength between the insulating layer 500 and the preliminary organic semiconductor layer 301 may be improved by the reaction between the first reactive group X and the functional group 510. Since the impurities on the insulating layer 500 are removed by the cleaning process, the bonding strength between the insulating layer 500 and the preliminary organic semiconductor layer 301 may be further increased. For example, the first reactive groups X of the organometallic precursors 331 and the functional group 510 of the insulating layer 500 may be silanol groups, and the bond between the preliminary organic semiconductor layer 301 and the insulating layer 500 may include a siloxane bond.

Figure 9A:
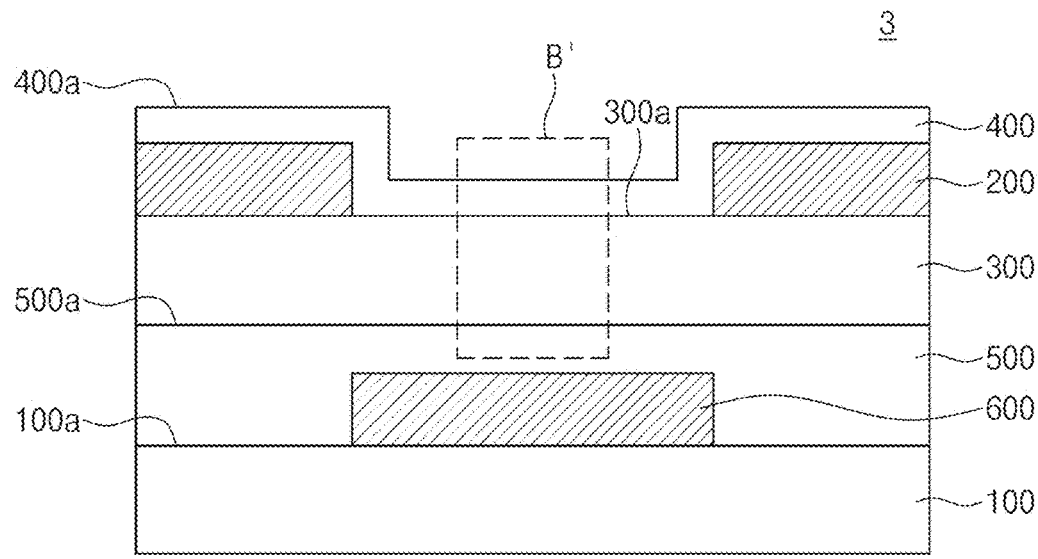
Figure 9B:
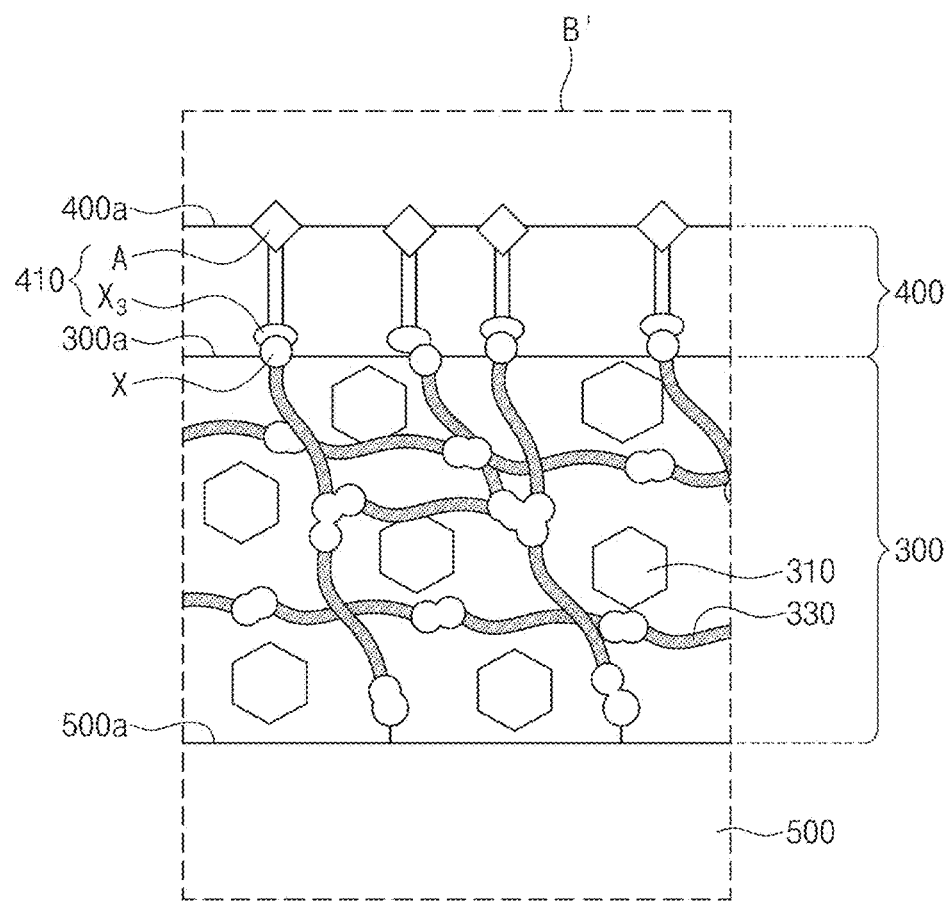

Referring to FIGS. 9A and 9B, the preliminary organic semiconductor layer 301 may be annealed to form a first organic semiconductor layer 300. The organometallic precursors 331 may be bonded to each other by the annealing process, thereby forming a network structure 330. The organic solvent 320 may be removed during the annealing process. The first organic semiconductor layer 300 may be chemically bonded to the insulating layer 500. The bond between the first organic semiconductor layer 300 and the insulating layer 500 may include a covalent bond such as a silanol bond. If the functional group 510 (see FIG. 7B) of the insulating layer 500 remains, the remaining functional group 510 may act as an electron/hole trap. However, according to some embodiments, the functional group 510 of the insulating layer 500 may be removed to improve electrical characteristics of the first organic semiconductor layer 300.

Source/drain patterns 200 may be formed on the first organic semiconductor layer 300. The source/drain patterns 200 may expose the top surface 300a of the first organic semiconductor layer 300. The first reactive groups X of the organometallic precursors 331 may be exposed on the top surface 300a of the first organic semiconductor layer 300.

Self-assembly precursors 410 may be applied to the top surface 300a of the first organic semiconductor layer 300 to form a self-assembled monolayer 400. The self-assembly precursor 410 may be represented by the chemical formula 2 described above. The second reactive group X3 of the self-assembly precursor 410 may be bonded to one of the first reactive groups X of the first organic semiconductor layer 300. In some embodiments, bonded first reactive groups X of the first organic semiconductor layer 300 may not function as a dopant. The first organic semiconductor layer 300 may have semiconductor properties after the formation of the self-assembled monolayer 400.

The functional group A of the self-assembled monolayer 400 may be exposed on the top surface 400a of the self-assembled monolayer 400. As illustrated in FIG. 9A, the self-assembled monolayer 400 may extend on the source/drain patterns 200 to cover the source/drain patterns 200. As a result, an organic semiconductor device 3 may be manufactured.

Hereinafter, examples, in which an organic semiconductor device according to some embodiments of the inventive concept is used, will be described in more detail.

Figure 10A:
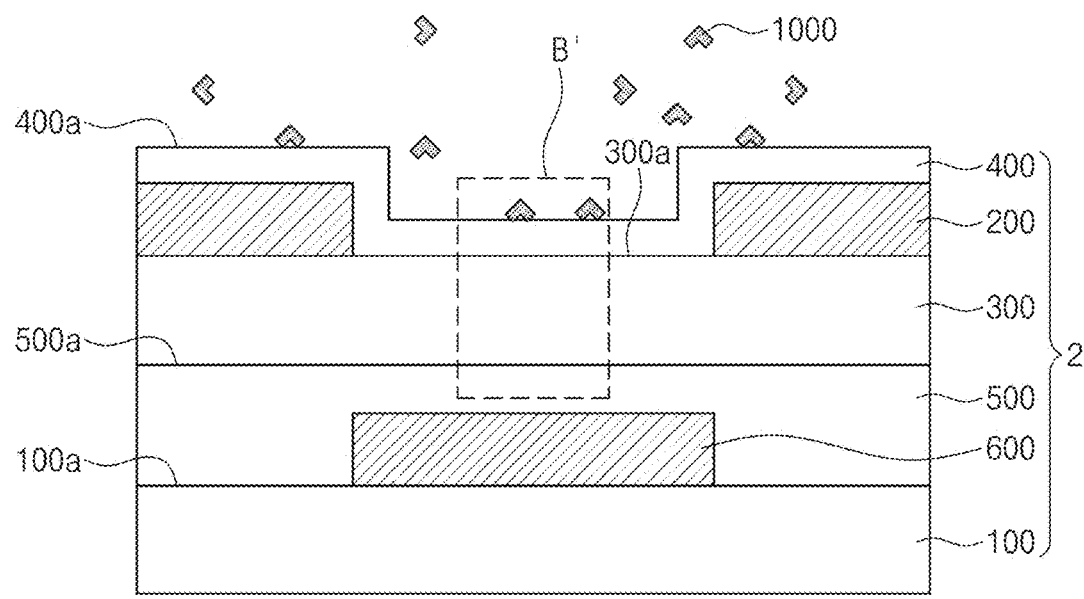
FIG. 10A is a schematic diagram illustrating an example, in which an organic semiconductor device according to some embodiments of the inventive concept is used.
Figure 10B:
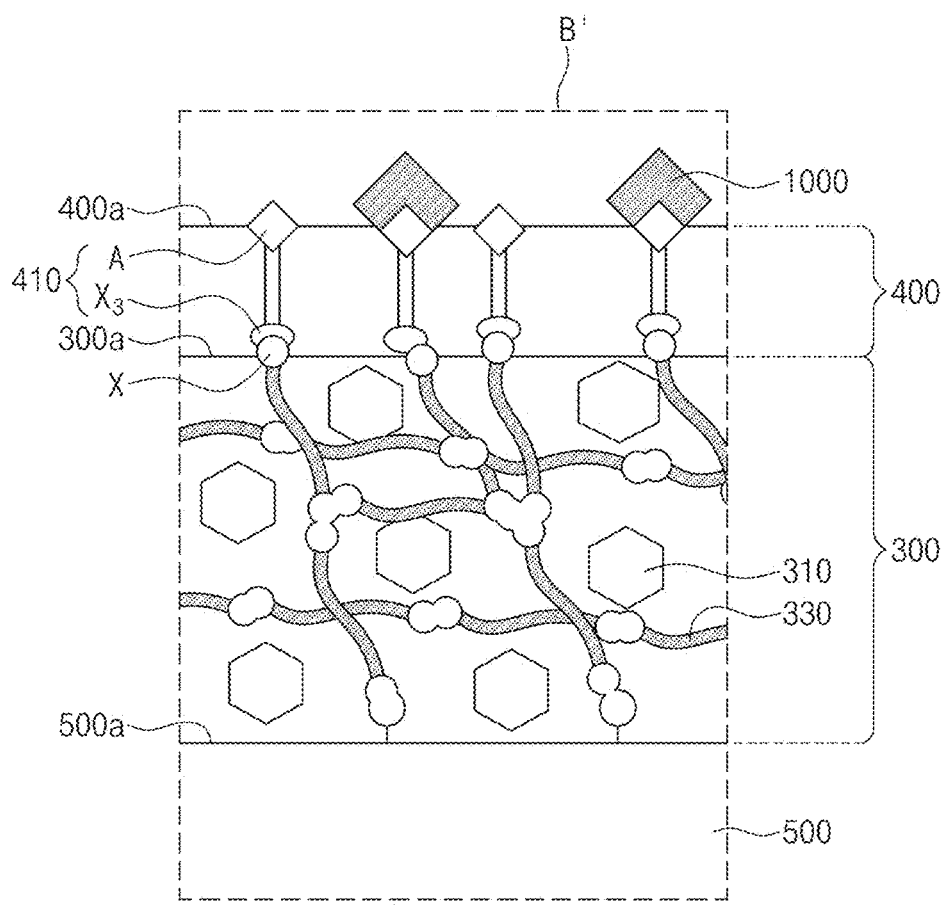
FIG. 10B is an enlarged view illustrating a region B' of FIG. 10A.

FIG. 10A is a schematic diagram illustrating an example, in which an organic semiconductor device according to some embodiments of the inventive concept is used. FIG. 10B is an enlarged view illustrating a region B' of FIG. 10A. For concise description, a previously described element may be identified by a similar or identical reference number without repeating an overlapping description thereof.

Referring to FIGS. 10A and 10B, an organic semiconductor device 3 may include a substrate 100, a gate pattern 600, an insulating layer 500, a first organic semiconductor layer 300, source/drain patterns 200, and a self-assembly monolayer 400. The organic semiconductor device 3 may be fabricated by the same method as that described with reference to FIGS. 7A to 9A and FIGS. 7B to 9B. The organic semiconductor device 3 may be used as a part of a sensor. A sample 1000 may be provided on the organic semiconductor device 3. For example, the sample 1000 may be provided on a top surface 400a of the self-assembly monolayer 400. The sample 1000 may contain a biological or chemical material. The sample 1000 may be provided in the form of liquid, solid, or gas.

As shown in FIG. 10B, the self-assembly monolayer 400 may have a functional group A that is different from a second reactive group X3 of the first organic semiconductor layer 300. A difference in affinity between the functional group A of the self-assembly monolayer 400 and the sample 1000 may be large. For example, the affinity of the functional group A of the self-assembly monolayer 400 with respect to the sample 1000 may be larger than that of the first organic semiconductor layer 300 with respect to the sample 1000. The sample 1000 may not be captured by the first organic semiconductor layer 300. In some embodiments, the self-assembly monolayer 400 may be provided on the first organic semiconductor layer 300. The functional group A of the self-assembly monolayer 400 may capture the sample 1000. Here, the capture of the sample 1000 may include adsorption or chemical bonding between the sample 1000 and the self-assembly monolayer 400. If the sample 1000 is captured by the self-assembly monolayer 400, electric characteristics of the organic semiconductor device 3 may be changed. For example, an energy band gap of the first organic semiconductor layer 300 may vary depending on whether the sample 1000 is captured or not. This may lead to a change in source/drain current of the organic semiconductor device 3. The sample 1000 may be quantitatively or qualitatively analyzed by measuring the change in the source/drain current.

Figure 11:
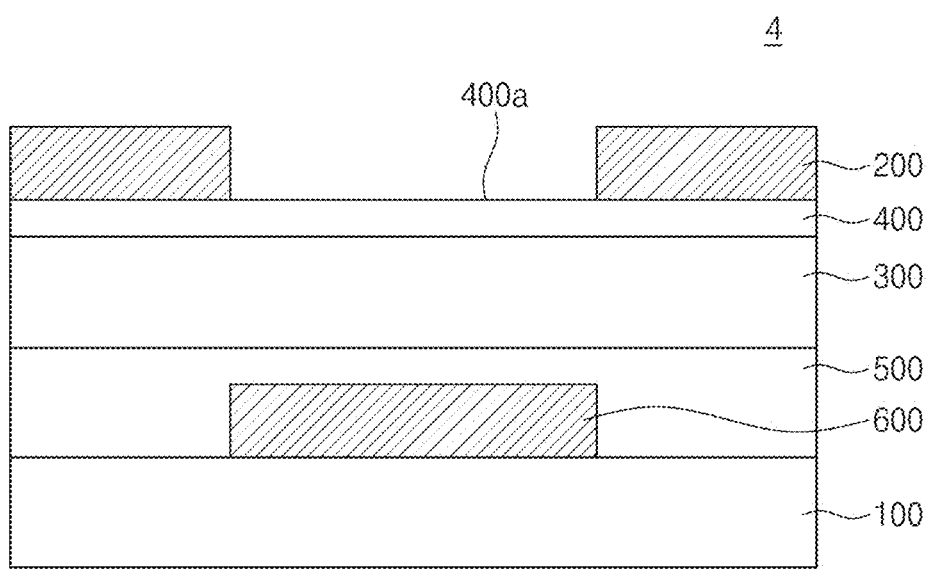
FIG. 11 is a sectional view illustrating an organic semiconductor device according to some embodiments of the inventive concept.

FIG. 11 is a sectional view illustrating an organic semiconductor device according to some embodiments of the inventive concept. For concise description, a previously described element may be identified by a similar or identical reference number without repeating an overlapping description thereof.

Referring to FIG. 11 in conjunction with FIG. 9B, an organic semiconductor device 4 may include a substrate 100, a gate pattern 600, a first organic semiconductor layer 300, a self-assembly monolayer 400, and source/drain patterns 200. The substrate 100, the gate pattern 600, the first organic semiconductor layer 300, the self-assembly monolayer 400, the source/drain patterns 200, and formation methods thereof may be substantially the same as those described with reference to FIGS. 7A to 9A and FIGS. 7B to 9B. However, in the organic semiconductor device 4, the source/drain patterns 200 may be formed before the formation of the self-assembly monolayer 400. The source/drain patterns 200 may be provided on the top surface 400a of the self-assembly monolayer 400. The source/drain patterns 200 may expose at least a portion of the top surface 400a of the self-assembly monolayer 400. The functional group A (e.g., see FIG. 9B) of the self-assembly monolayer 400 may be provided on the top surface 400a of the self-assembly monolayer 400. The organic semiconductor device 4 may be used for a variety of electronic devices (e.g., a sensor).

Figure 12A:
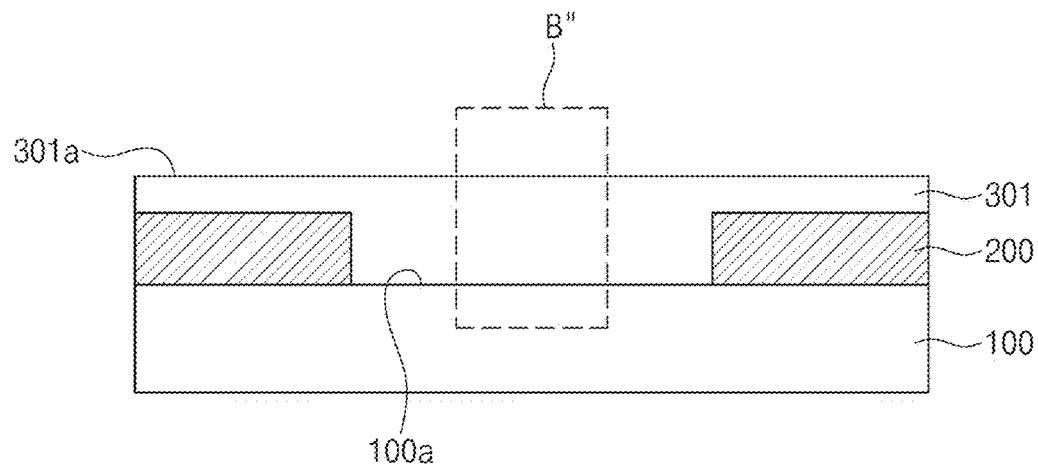
FIGS. 12A and 13A are sectional views illustrating a process of fabricating an organic semiconductor device, according to some embodiments of the inventive concept.
Figure 12B:
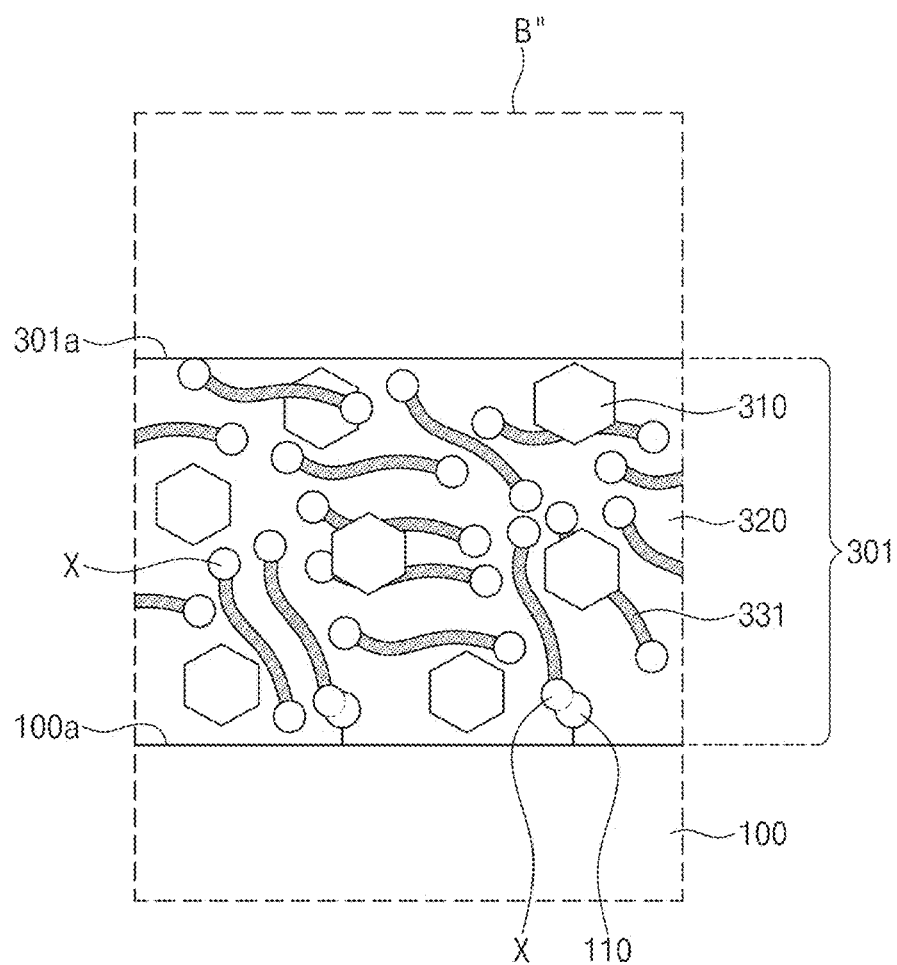
FIGS. 12B and 13B are enlarged views illustrating regions B'' of FIGS. 12A and 13A, respectively.
Figure 13A:
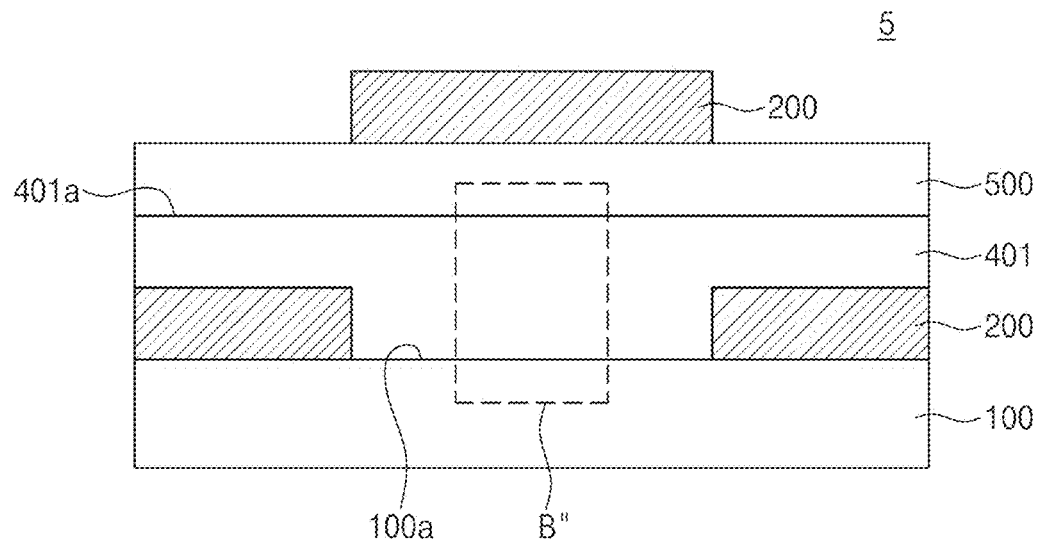
Figure 13B:
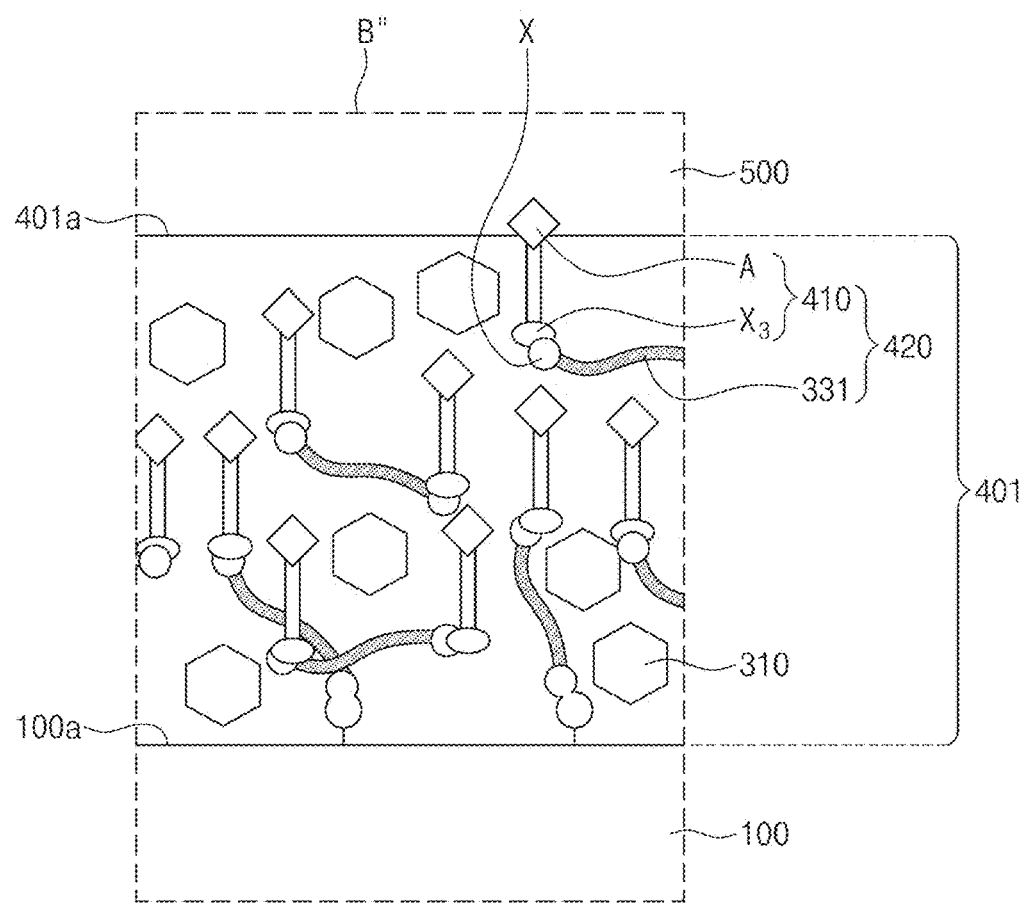

FIGS. 12A and 13A are sectional views illustrating a process of fabricating an organic semiconductor device, according to some embodiments of the inventive concept. FIGS. 12B and 13B are enlarged views illustrating regions B" of FIGS. 12A and 13A, respectively. For concise description, a previously described element may be identified by a similar or identical reference number without repeating an overlapping description thereof.

Referring to FIGS. 12A and 12B, a source/drain pattern 200 and a preliminary organic semiconductor layer 301 may be formed on a substrate 100. The preliminary organic semiconductor layer 301 may include an organic semiconductor material 310, organometallic precursors 331, and organic solvent 320. The source/drain pattern 200 and the preliminary organic semiconductor layer 301 may be formed by substantially the same method as that described with reference to FIGS. 1A, 1B, 2A, and 2B.

Referring to FIGS. 13A and 13B, a second organic semiconductor layer 401 may be formed by providing a functional precursor 410 on the preliminary organic semiconductor layer 301. The second organic semiconductor layer 401 may include the organic semiconductor material 310 and composites 420. The chemical structure of the self-assembly precursor 410 may be expressed by the chemical formula 2. The self-assembly precursor 410 may include a plurality of self-assembly precursors 410. The composites 420 may be formed by bonding between second reactive groups X3 of the self-assembly precursors 410 and first reactive groups X of the organometallic precursors 331. The bonding may include silanol bonding. The more the composites 420, the lower a content ratio of the first reactive groups X in the second organic semiconductor layer 401. For example, the first reactive groups X may be removed by the bonding. Thus, the second organic semiconductor layer 401 may exhibit a semiconductor property. The organic semiconductor material 310 may not react with the self-assembly precursors 410. Thereafter, the organic solvent 320 may be removed.

In the second organic semiconductor layer 401, the organic semiconductor material 310 may be in contact with, but not be chemically bonded with, the composites 420. The composites 420 may be dispersed in the second organic semiconductor layer 401. The composites 420 may have functional groups A which are originated from the functional groups A of the self-assembly precursors 410. The functional groups A of the composites 420 may be used as dopants of the organic semiconductor material 310. The kind of the dopants may be dependent on the kind of the functional groups A. For example, in the case where the functional groups A contain electron donating groups, the functional groups A may be used as n-type dopants of the organic semiconductor material 310. In the case where the functional groups A contain electron withdrawing groups, the functional groups A may be used as p-type dopants of the organic semiconductor material 310.

At least a portion of the functional groups A of the composites 420 may be exposed through a top surface 401a of the second organic semiconductor layer 401. Affinity of the second organic semiconductor layer 401 with respect to a specific material may be different from that of the preliminary organic semiconductor layer 301 with respect to the material. Here, the affinity of the second organic semiconductor layer 401 may mean the affinity of the functional groups A of the composites 420. Thereafter, the insulating layer 500 and the gate pattern 600 may be formed on the top surface 401a of the second organic semiconductor layer 401, as shown in FIG. 13A. The insulating layer 500 and the gate pattern 600 may be formed by the same method as that described with reference to FIGS. 5A and 5B. As a result, an organic semiconductor device 5 may be fabricated.

Figure 14A:
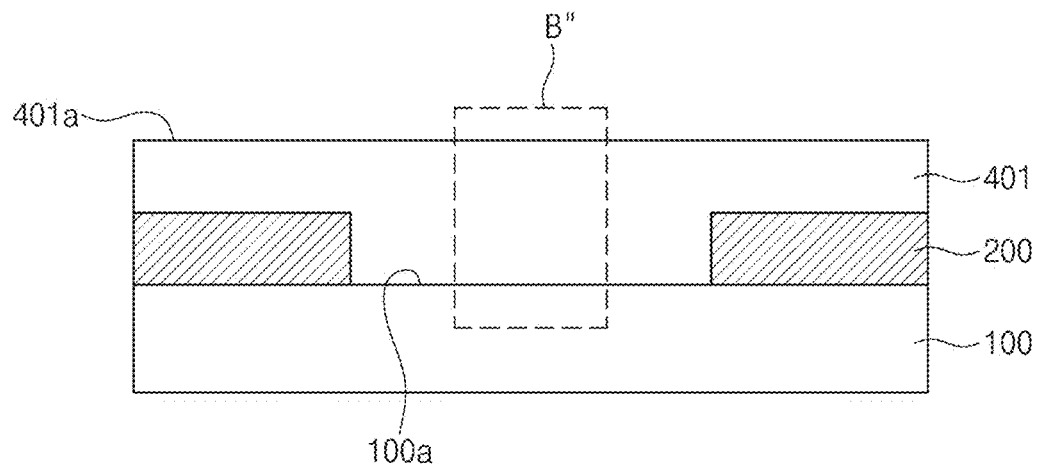
FIGS. 14A and 15A are sectional views illustrating a process of fabricating an organic semiconductor device, according to some embodiments of the inventive concept.
Figure 14B:
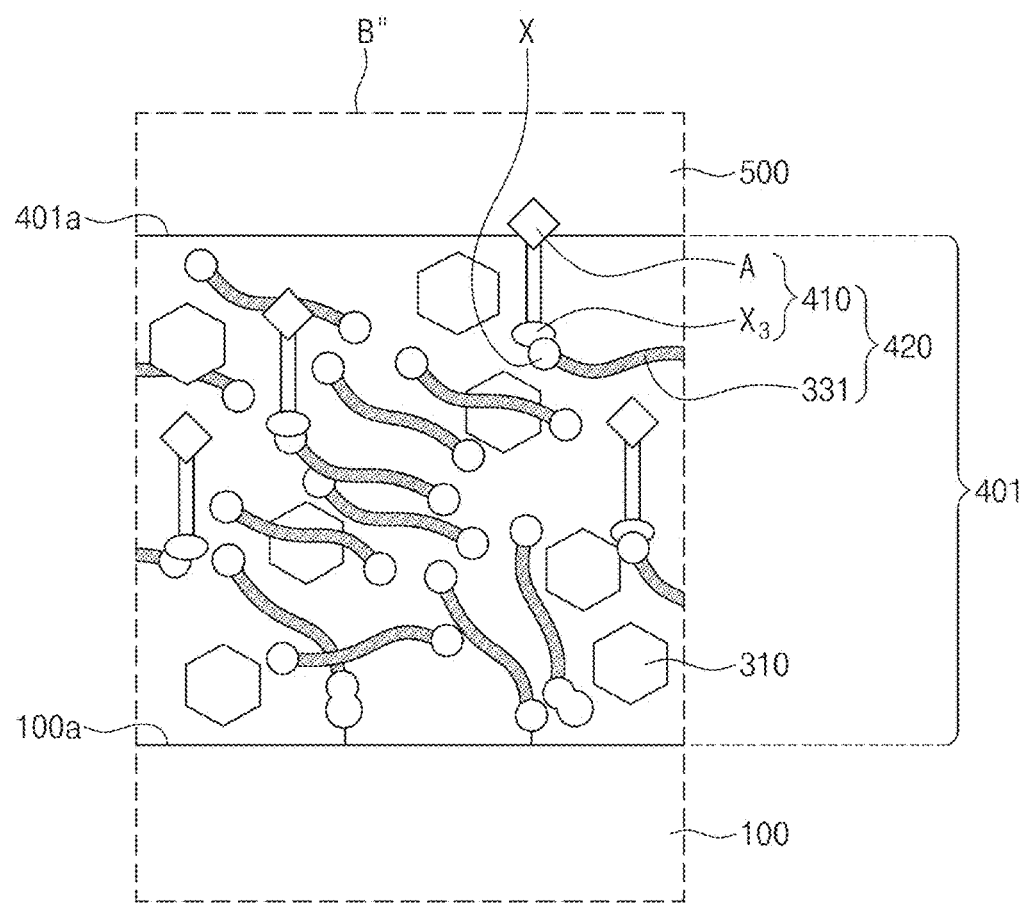
FIGS. 14B and 15B are enlarged views illustrating regions B'' of FIGS. 14A and 15A, respectively.
Figure 15A:
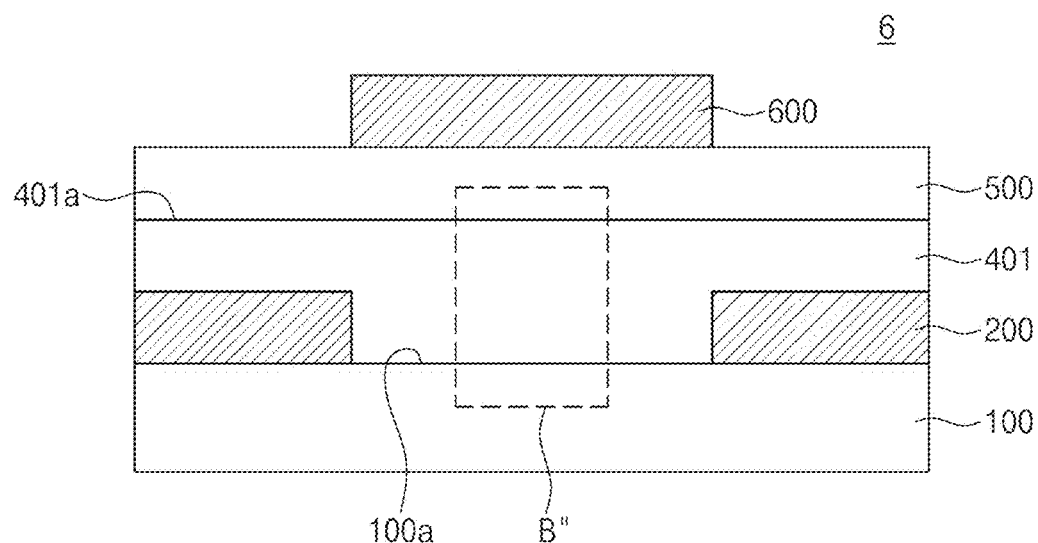
Figure 15B:
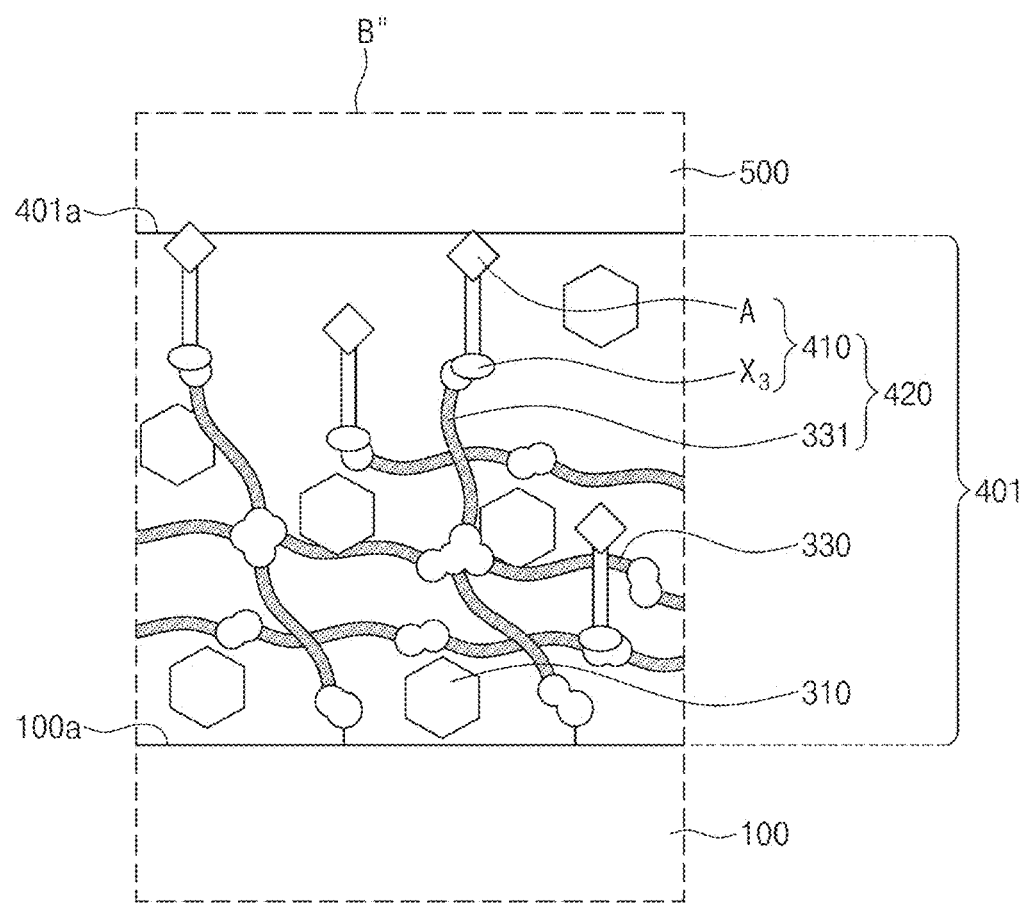

FIGS. 14A and 15A are sectional views illustrating a process of fabricating an organic semiconductor device, according to some embodiments of the inventive concept. FIGS. 14B and 15B are enlarged views illustrating regions B" of FIGS. 14A and 15A, respectively. For concise description, a previously described element may be identified by a similar or identical reference number without repeating an overlapping description thereof.

Referring to FIGS. 14A and 14B, source/drain patterns 200 and a second organic semiconductor layer 401 may be formed on a substrate 100. The second organic semiconductor layer 401 may be formed by the same method as that described with reference to FIGS. 12A to 12B. However, a ratio between the self-assembly precursors 410 and the organometallic precursors 331 may be controlled to allow at least a portion of the second reactive groups X3 of the organometallic precursors 331 to be excluded from the reaction, and thus, the portion of the second reactive groups X3 may remain, as shown in FIG. 14B.

Referring to FIGS. 15A and 15B, the second organic semiconductor layer 401 may be annealed. At least two of the first reactive groups X of the organometallic precursors 331 may be bonded to form a network structure 330. The second organic semiconductor layer 401 may include the network structure 330 and the composite 420, in addition to the organic semiconductor material 310. The composite 420 may be bonded to the network structure 330, but is not limited thereto. Thus, in the case where the first reactive groups X are further removed, the second organic semiconductor layer 401 may exhibit a semiconductor property. Thereafter, the insulating layer 500 and the gate pattern 600 may be formed on the top surface 401a of the second organic semiconductor layer 401, as shown in FIG. 15A. The insulating layer 500 and gate pattern 600 may be formed by the same method as that described with reference to FIGS. 5A and 5B, and as a result, an organic semiconductor device 6 may be fabricated.

Figure 16:
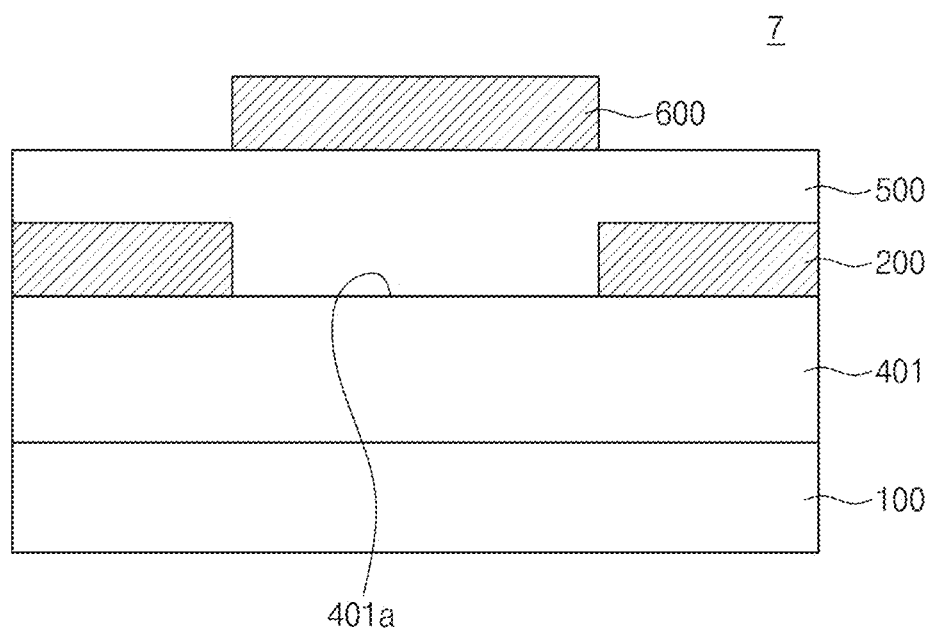
FIG. 16 is a sectional view illustrating an organic semiconductor device according to some embodiments of the inventive concept.

FIG. 16 is a sectional view illustrating an organic semiconductor device according to some embodiments of the inventive concept. For concise description, a previously described element may be identified by a similar or identical reference number without repeating an overlapping description thereof.

Referring to FIG. 16, an organic semiconductor device 7 may include a substrate 100, a second organic semiconductor layer 401, source/drain patterns 200, an insulating layer 500, and a gate pattern 600. The substrate 100, the second organic semiconductor layer 401, the source/drain patterns 200, the insulating layer 500, the gate pattern 600, and formation methods thereof may be the same as those in the examples described with reference to FIGS. 12A, 12B, 13A, and 13B or FIGS. 14A, 14B, 15A, and 15B. However, in the organic semiconductor device 7, the source/drain patterns 200 may be formed on the second organic semiconductor layer 401. The source/drain patterns 200 may be formed to expose a portion of the top surface 401a of the second organic semiconductor layer 401. The insulating layer 500 may be formed on the second organic semiconductor layer 401 and the source/drain patterns 200.

Figure 17A:
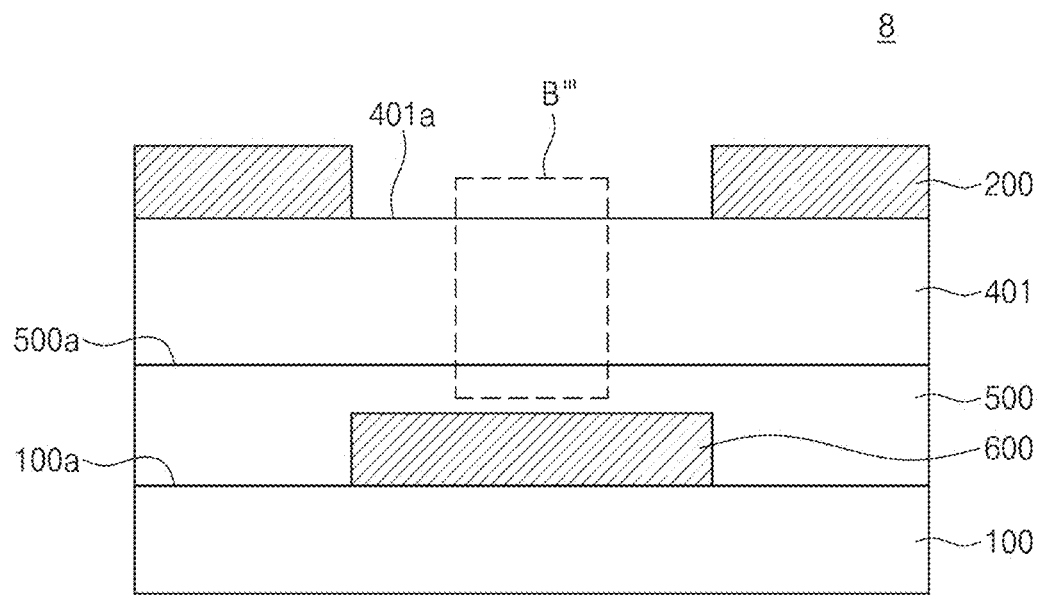
FIG. 17A is a sectional view illustrating an organic semiconductor device according to some embodiments of the inventive concept.
Figure 17B:
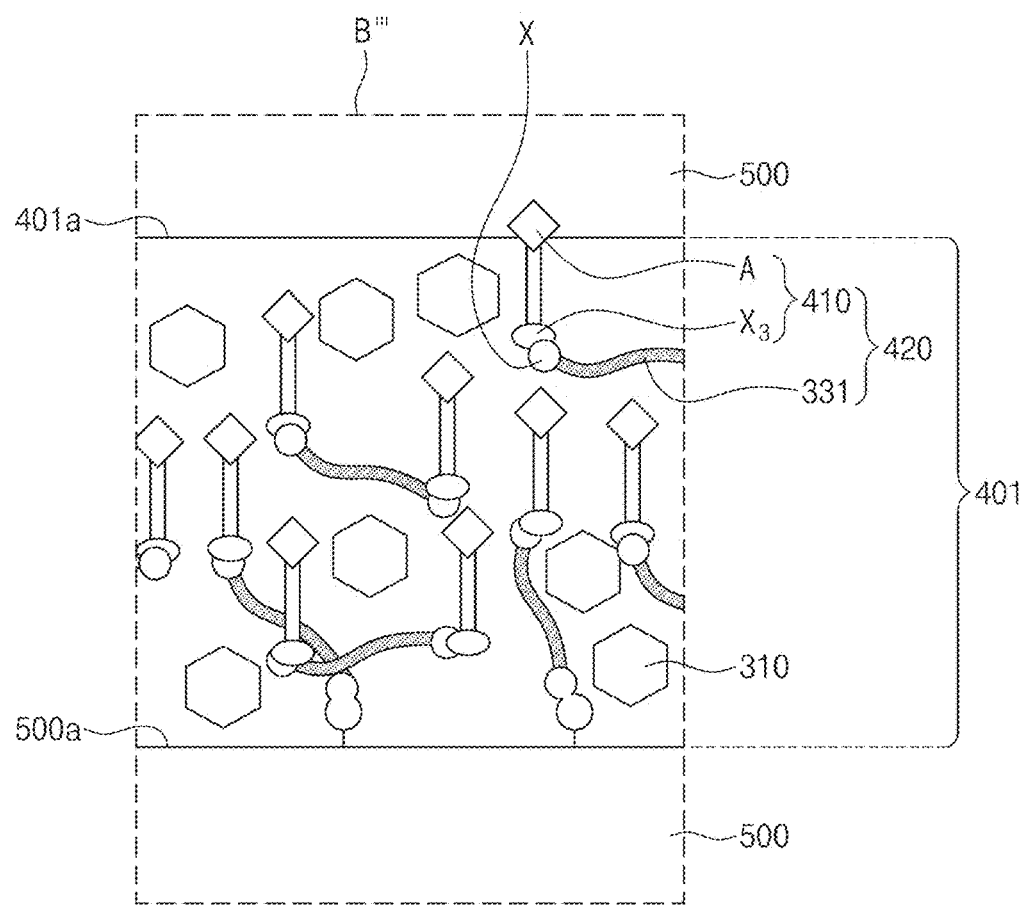
FIG. 17B is an enlarged view illustrating a region B'' of FIG. 17A.
Figure 17C:
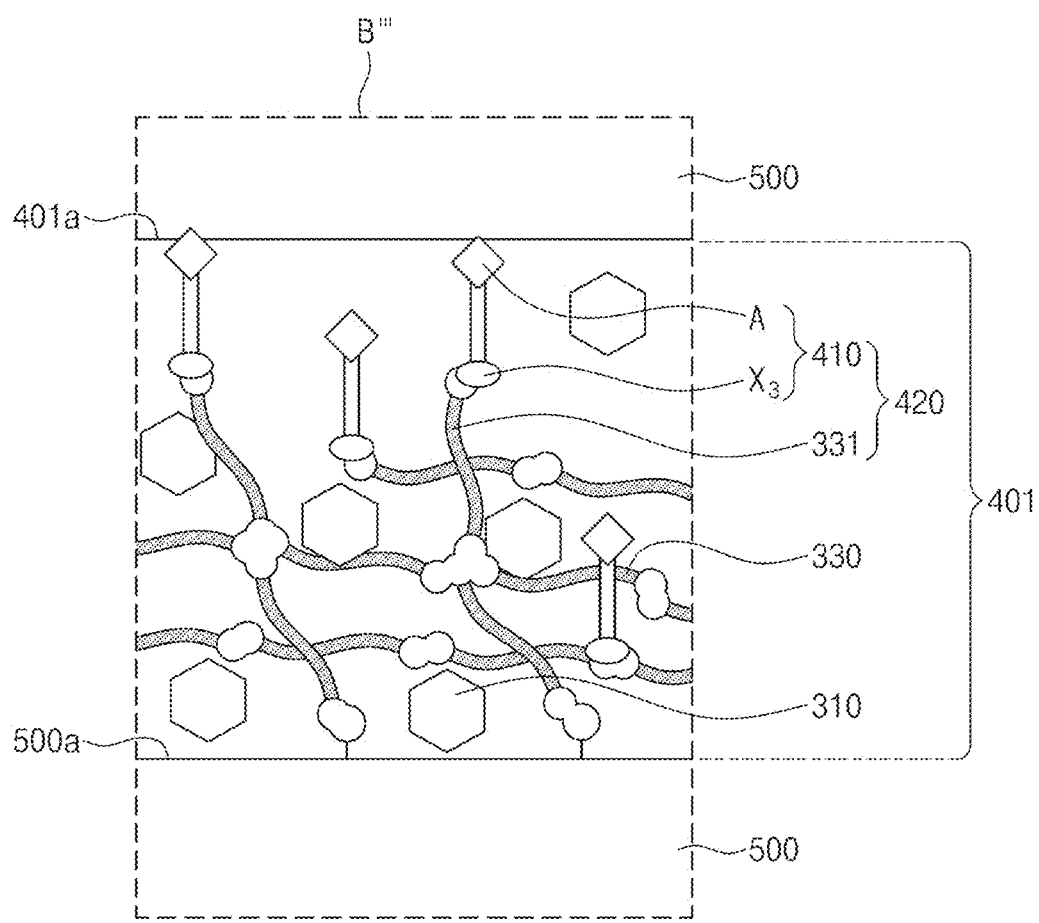
FIG. 17C is an enlarged view illustrating a portion, which corresponds to the region B'' of FIG. 17A and includes a second organic semiconductor layer of an organic semiconductor device according to some embodiments of the inventive concept.

FIG. 17A is a sectional view illustrating an organic semiconductor device according to some embodiments of the inventive concept. FIG. 17B is an enlarged view illustrating a region B" of FIG. 17A. FIG. 17C is an enlarged view illustrating a portion, which corresponds to the region B" of FIG. 17A and includes a second organic semiconductor layer of an organic semiconductor device according to some embodiments of the inventive concept. For concise description, a previously described element may be identified by a similar or identical reference number without repeating an overlapping description thereof.

Referring to FIGS. 17A to 17C, an organic semiconductor device 8 may include a substrate 100, a gate pattern 600, an insulating layer 500, a second organic semiconductor layer 401, and source/drain patterns 200. The organic semiconductor device 8 may be used as a part of an electronic device such as a sensor. The substrate 100, the gate pattern 600, the insulating layer 500, and the source/drain patterns 200 may be substantially the same as those described with reference to FIGS. 7A to 9B. However, in the organic semiconductor device 8, the second organic semiconductor layer 401 may be formed, instead of the first organic semiconductor layer 300 and the self-assembly monolayer 400. The second organic semiconductor layer 401 may include an organic semiconductor material 310 and composites 420. Hereinafter, the second organic semiconductor layer 401 and a formation method thereof will be described in more detail.

As shown in FIG. 17B, the organic semiconductor layer 401 may include the organic semiconductor material 310 and the composites 420. As described with reference to the examples of FIGS. 12A, 12B, 13A, and 13B, the second organic semiconductor layer 401 may be formed by providing a self-assembly precursor 410 on the preliminary organic semiconductor layer 301.

Referring to FIG. 17C, the second organic semiconductor layer 401 may include a network structure 330 and a composite 420, in addition to the organic semiconductor material 310. The network structure 330 may be formed by performing an annealing process on the second organic semiconductor layer 401, as described with reference to FIGS. 15A and 15B.

Hereinafter, a method of fabricating an organic semiconductor device and characteristics of the organic semiconductor device will be described in detail with reference to experimental examples of the present invention.

COMPARATIVE EXAMPLE 1-1

Diketopyrrolo-pyrrole-dithiophenethienothiophene (hereinafter, DPP-DTT) was prepared as an organic semiconductor material. The DPP-DTT was added into 80° C. chlorobenzene solution. The solution was stirred at 80° C. for 1 hour to prepare an organic semiconductor solution. A silicon oxide layer was formed by depositing silicon oxide on a silicon substrate. The organic semiconductor solution was spin-coated on the silicon oxide layer to form a preliminary organic semiconductor layer. Thereafter, the preliminary organic semiconductor layer was thermally treated at 180° C. for 3 hours to form a first organic semiconductor layer.

The silicon substrate was dipped into isopropyl alcohol and then was treated for 5 minutes using ultrasonic waves. The first organic semiconductor layer was observed.

COMPARATIVE EXAMPLE 1-2

A first organic semiconductor layer was formed using the same method as that in the comparative example 1-1. However, a gate pattern was formed between a silicon substrate and a silicon oxide layer. Source/drain patterns were formed on the first organic semiconductor layer.

EXPERIMENTAL EXAMPLE 1-1

Diketopyrrolo-pyrrole-dithiophenethienothiophene (hereinafter, DPP-DTT) was prepared as an organic semiconductor material. The DPP-DTT was added into 80° C. chlorobenzene solution. After about 1 hour 30 minutes, 1,8-bis(trichlorosilyl)octane was added into the chlorobenzene solution. The solution was stirred at 80° C. for 1 hour to prepare an organic semiconductor solution. A silicon oxide layer was formed by depositing silicon oxide on a silicon substrate. The organic semiconductor solution was spin-coated on the silicon oxide layer to form a preliminary organic semiconductor layer. Thereafter, the preliminary organic semiconductor layer was thermally treated at 180° C. for 3 hours to form a first organic semiconductor layer.

The silicon substrate was dipped into isopropyl alcohol and then was treated for 5 minutes using ultrasonic waves.

EXPERIMENTAL EXAMPLE 1-2

A first organic semiconductor layer was formed using the same method as that in the experimental example 1-1. However, a gate pattern was formed between a silicon substrate and a silicon oxide layer. Source/drain patterns were formed on the first organic semiconductor layer.

COMPARATIVE EXAMPLE 2

A first organic semiconductor layer was formed using the same method as that in the experimental example 1-1. However, a thermal treatment process was not performed on the first organic semiconductor layer.

EXPERIMENTAL EXAMPLE 2-1

A first organic semiconductor layer was formed using the same method as that in the experimental example 1. The first organic semiconductor layer was thermally treated at 180° C. for 1 hour.

EXPERIMENTAL EXAMPLE 2-2

A first organic semiconductor layer was formed using the same method as that in the experimental example 1. The first organic semiconductor layer was thermally treated at 180° C. for 2 hours.

EXPERIMENTAL EXAMPLE 2-3

A first organic semiconductor layer was formed using the same method as that in the experimental example 1. The first organic semiconductor layer was thermally treated at 180° C. for 3 hours.

EXPERIMENTAL EXAMPLE 3-1

A gate electrode was formed on a silicon substrate. A silicon oxide layer was formed on the gate electrode. Diketopyrrolo-pyrrole-dithiophenethienothiophene (hereinafter, DPP-DTT) was prepared as an organic semiconductor material. The DPP-DTT was added into 80° C. chlorobenzene solution. The solution was stirred at 80° C. for 1 hour to prepare an organic semiconductor solution. The organic semiconductor solution was spin-coated on the silicon oxide layer to form a preliminary organic semiconductor layer. The preliminary organic semiconductor layer was thermally treated at 180° C. to form a first organic semiconductor layer. Thereafter, source/drain patterns were formed on the first organic semiconductor layer.

EXPERIMENTAL EXAMPLE 3-2

A gate electrode was formed on a silicon substrate. A silicon oxide layer was formed on the gate electrode. Diketopyrrolo-pyrrole-dithiophenethienothiophene (hereinafter, DPP-DTT) was prepared as an organic semiconductor material. The DPP-DTT was added into 80° C. chlorobenzene solution. The solution was stirred at 80° C. for 1 hour to prepare an organic semiconductor solution. The organic semiconductor solution was spin-coated on the silicon oxide layer to form a preliminary organic semiconductor layer. The preliminary organic semiconductor layer was thermally treated at 180 to form a first organic semiconductor layer. Octadecyltrichlorosilane (hereinafter, ODTS) was coated on the first organic semiconductor layer to form a self-assembly monolayer. Thereafter, source/drain patterns were formed on the self-assembly monolayer.

EXPERIMENTAL EXAMPLE 3-3

An organic semiconductor device was fabricated using the same method as that in the experimental example 3-1. However, in this example, 4-Aminopropyl(triethoxysilane) (hereinafter, APS), instead of ODTS, was used to form the self-assembly monolayer.

COMPARATIVE EXAMPLE 4

An organic semiconductor device was fabricated using the same method as that in the comparative example 3. However, the thermal treatment process was not performed.

EXPERIMENTAL EXAMPLE 4-1

An organic semiconductor device was fabricated using the same method as that in the experimental example 3-1. However, in this example, the thermal treatment process was not performed, and ODTS was coated on the preliminary organic semiconductor layer to form a second organic semiconductor layer.

EXPERIMENTAL EXAMPLE 4-2

An organic semiconductor device was fabricated using the same method as that in the experimental example 3-2. However, in this example, the thermal treatment process was not performed, and APS was coated on the preliminary organic semiconductor layer to form a second organic semiconductor layer.

Table 1 shows evaluation results on bonding properties of the experimental example 1-1 and the comparative example 1-1.

TABLE 1

|  | presence of organometallic precursor in the organic semiconductor solution | Evaluation Results Results of observation of first organic semiconductor layer, after ultrasonic wave treatment |
|---|---|---|
| Comparative example 1-1 | X | Damaged |
| Experimental example 1-1 | O | Good |

Referring to Table 1 in conjunction with FIG. 8A, after an ultrasonic wave treatment, an appearance of the first organic semiconductor layer 300 in the experimental example 1-1 was good, but the first organic semiconductor layer 300 in the comparative example 1-1 was damaged. An organic semiconductor solution used in the experimental example 1-1 was prepared to further contain organometallic precursors 331, when compared to that in the comparative example 1-1. In the case of the experimental example 1-1, owing to the reaction between the organometallic precursors 331 and the functional group 510 of the insulating layer 500, a bonding strength between the insulating layer 500 and the first organic semiconductor layer 300 was increased.

Figure 18:
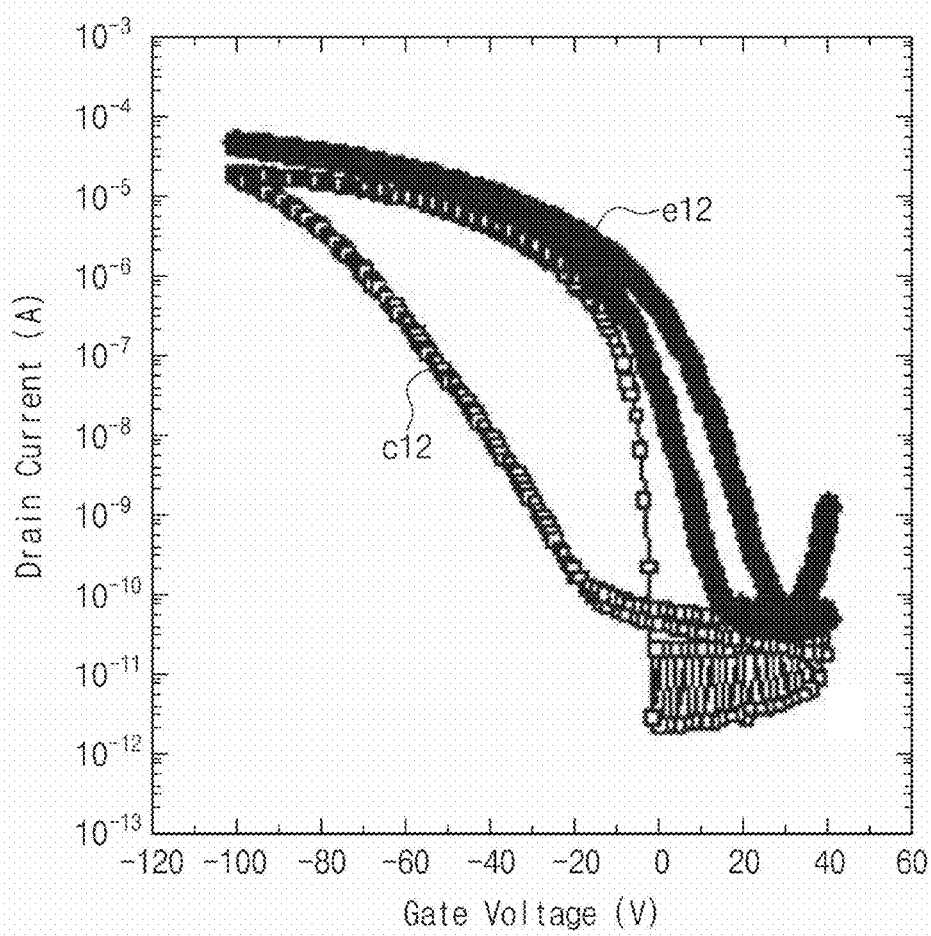
FIG. 18 is a graph showing electric characteristics measured in an experimental example 1-2 and a comparative example 1-2.

FIG. 18 is a graph showing electric characteristics measured in the experimental example 1-2 and the comparative example 1-2. In FIG. 18, the x axis represents the gate voltage and the y axis represents the drain current.

Referring to FIG. 18 in conjunction with FIG. 8B, in the comparative example 1-2 (c12), a hysteresis property was more clearly observed, compared to that in the experimental example 1-2 (e12). In the comparative example 1-2 (c12), the organometallic precursors 331 were not used to allow the functional group 510 to remain in the insulating layer 500. The functional group 510 of the insulating layer 500 may act as an electron/hole trapping site and may lead to deterioration in electric characteristics of an organic semiconductor device. In the experimental example 1-2 (e12), since the functional groups X of the organometallic precursors 331 are reacted with the functional group 510 of the insulating layer 500, the functional group 510 of the insulating layer 500 may be removed. Thus, the improved electric characteristics in the experimental example 1-2 (e12) may result from the removal of the functional group 510.

Figure 19:
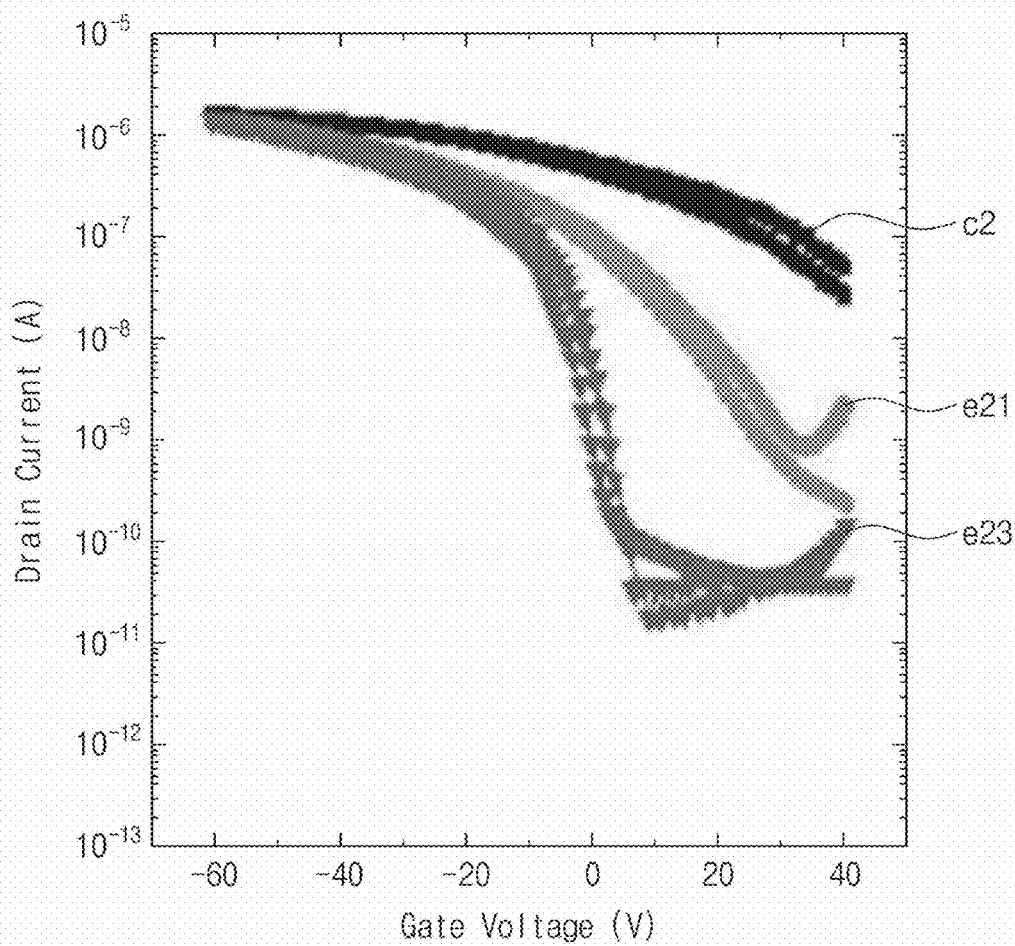
FIG. 19 is a graph showing electric characteristics measured in an experimental example 1-2, an experimental example 2-3, and a comparative example 2.

FIG. 19 is a graph showing electric characteristics measured in the experimental examples 2-1, and 2-3 and the comparative example 2. In FIG. 19, the x axis represents the gate voltage and the y axis represents the drain current.

Referring to FIG. 19, the experimental examples 2-1 and 2-3 (e21 and e23) exhibited an on-off property, whereas the comparative example2 (c2) did not exhibit the on-off property. In the comparative example2 (c2), the preliminary organic semiconductor layer 301 was used as a channel layer. Since, as shown in FIG. 8B, the first reactive groups X of the organometallic precursor 331 are provided in the preliminary organic semiconductor layer 301, the preliminary organic semiconductor layer 301 may not exhibit a semiconductor property, as shown in FIG. 19. In the experimental examples 2-1 and 2-3 (e21 and e23), as a result of a thermal treatment process on the preliminary organic semiconductor layer 301, the first reactive groups X of the organometallic precursors 331 may be bonded to each other, thereby forming the network structure 330, as shown in FIG. 9B. a content ratio of the first reactive groups X in the first organic semiconductor layer 300 may be decreased. Thus, the first organic semiconductor layer 300 may exhibit a semiconductor property, as shown in FIG. 19.

Table 2 shows contact angles measured in the experimental examples 2-1, 2-2, 3-1, and 3-2.

TABLE 2

| Experimental Example | Material used to form self-assembly monolayer (Self-assembly precursor) | Contact angle of first organic semiconductor layer (°) | Contact angle of self-assembly monolayer (°) |
|---|---|---|---|
| 3-1 | OTDS | 92.8 | 96.9 |
| 3-2 | APS | 92.8 | 89.3 |

Referring to Table 2 in conjunction with FIGS. 9A and 9B, in the experimental examples 3-1 and 3-2, the contact angle of the self-assembly monolayer 400 was different from that of the first organic semiconductor layer 300. This shows that the functional group A of the self-assembly monolayer 400 differs from the first reactive groups X of the first organic semiconductor layer 300 and that the affinity of the self-assembly monolayer 400 with respect to the water is different from that of the first organic semiconductor layer 300 with respect to the water.

In the experimental example 3-1, OTDS was used to form the self-assembly monolayer 400, whereas in the experimental example 3-2, APS was used to form the self-assembly monolayer 400. This result shows that the affinity of the self-assembly monolayer 400 with respect to the water may vary depending on the kind of the self-assembly monolayer 400.

Table 3 shows contact angles measured in the experimental examples 4-1 and 4-2.

TABLE 3

| Experimental Example | Material used to form self-assembly monolayer (Self-assembly precursor) | Contact angle of preliminary organic semiconductor layer (°) | Contact angle of second organic semiconductor layer (°) |
|---|---|---|---|
| 4-1 | OTDS | 93.1 | 101.4 |
| 4-2 | APS | 93.1 | 83.0 |

Referring to Table 2 in conjunction with FIGS. 17A and 17B, in the experimental examples 4-1 and 4-2, the contact angle of the second organic semiconductor layer 401 was different from that of the preliminary organic semiconductor layer 301. This result shows that the functional group A of the second organic semiconductor layer 401 differs from the first reactive groups X of the organometallic precursors 331 of the preliminary organic semiconductor layer 301 and that affinity of the second organic semiconductor layer 401 with respect to the water is different from that of the preliminary organic semiconductor layer 301 with respect to the water.

In the experimental example 4-1, OTDS was used to form the second organic semiconductor layer 401, whereas in the experimental example 4-2, APS was used to form the second organic semiconductor layer 401. Table 2 shows that the affinity of the second organic semiconductor layer 401 with respect to the water may vary depending on the kind of the self-assembly precursor 410

Figure 20A:
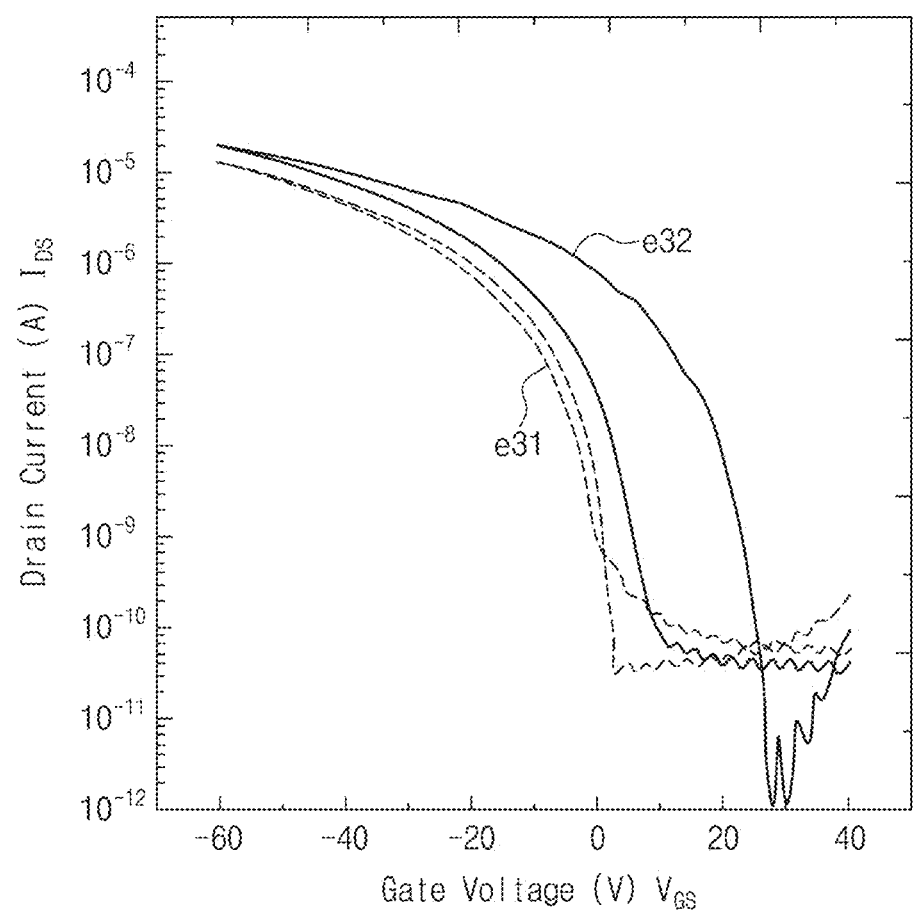
FIG. 20A is a graph showing electric characteristics measured in an experimental example 3-1 and an experimental example 3-2.
Figure 20B:
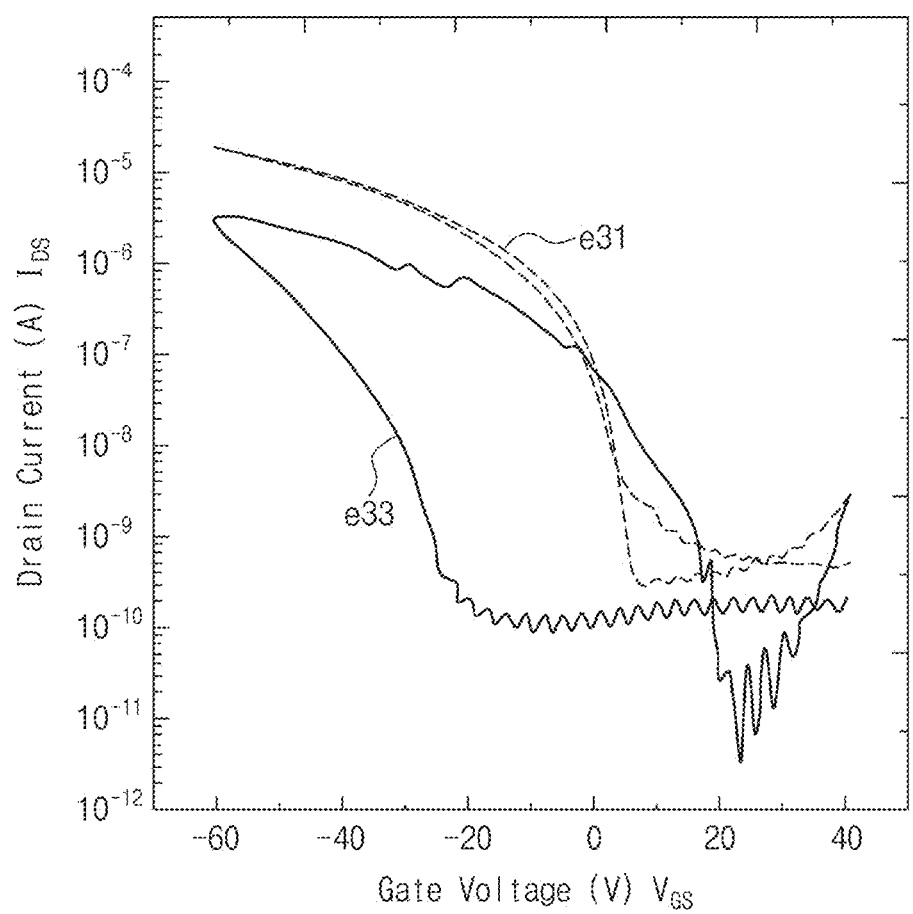
FIG. 20B is a graph showing electric characteristics measured in an experimental example 3-1 and an experimental example 3-3.

FIG. 20A is a graph showing electric characteristics measured in the experimental example 3-1 and the experimental example 3-2. FIG. 20B is a graph showing electric characteristics measured in the experimental example 3-1 and the experimental example 3-3. In FIGS. 20A and 20B, the x axis represents the gate voltage and the y axis represents the drain current. Hereinafter, the graphs of FIGS. 20A and 20B will be described with reference to FIGS. 8B and 9B.

Referring to FIGS. 20A and 20B, the experimental examples 3-1, 3-2, and 3-3 (e31, e32, and e33) exhibited an on-off property. In an annealing process on the preliminary organic semiconductor layer 301, the first reactive groups X of the organometallic precursors 331 may be bonded to each other, and thus, the first reactive groups X may not be provided in the first organic semiconductor layer 300. FIG. 20A shows that the experimental example 3-2 (e32) had electric characteristics different from the experimental example 3-1 (e31), and FIG. 20B shows that the experimental example 3-3 (e33) had electric characteristics different from the experimental example 3-1 (e31). The experimental examples 3-2 and 3-3 (e32 and e33) may include the self-assembly monolayer 400, and thus, as shown in FIGS. 20A and 20B, they may exhibit electric characteristics different from those of the experimental example 3-1 (e31).

Figure 20C:
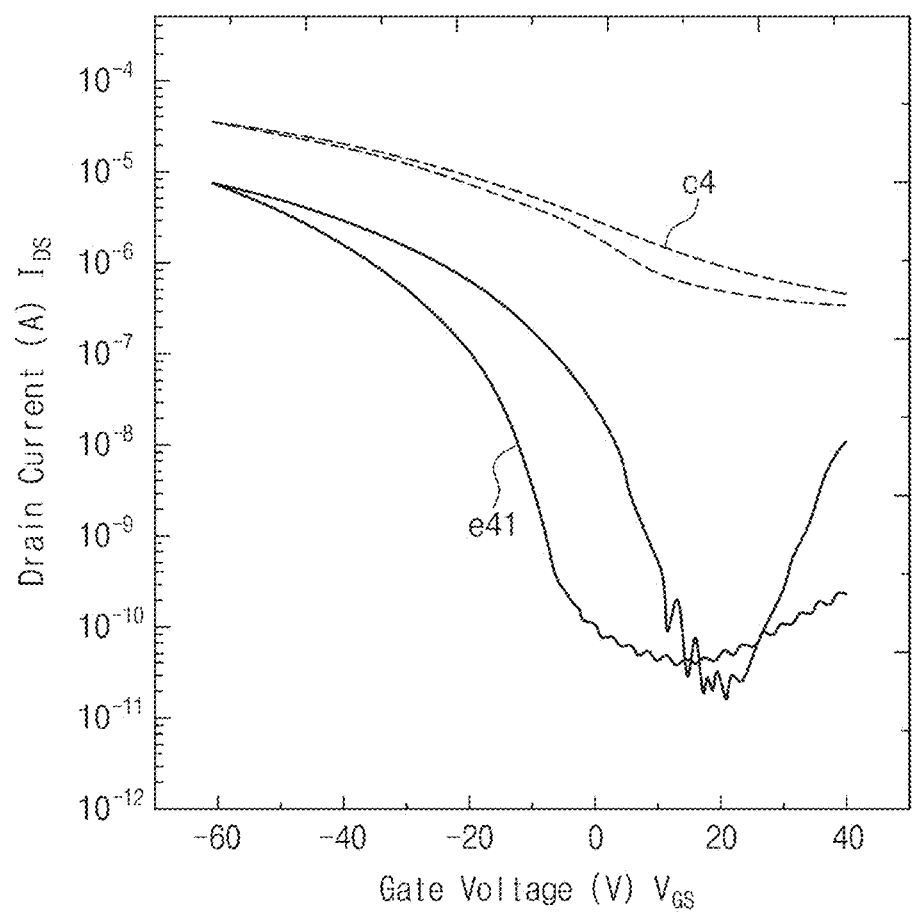
FIG. 20C is a graph showing electric characteristics measured in an experimental example 4-1 and a comparative example 4.
Figure 20D:
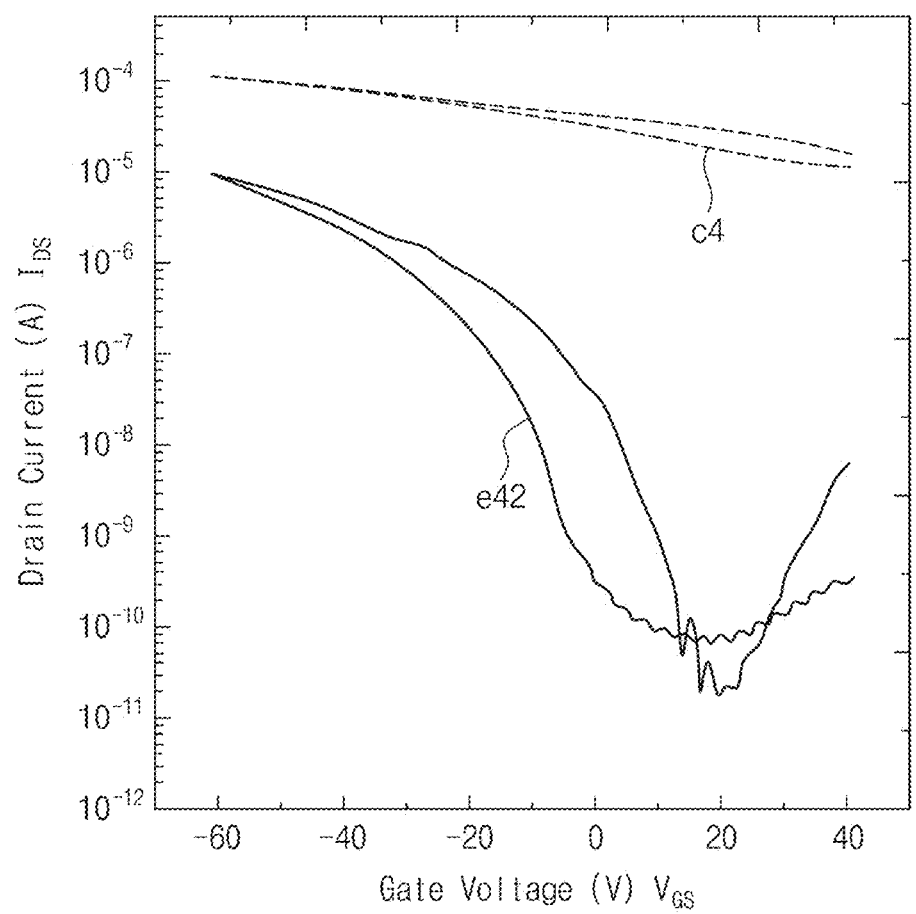
FIG. 20D is a graph showing electric characteristics measured in an experimental example 4-2 and a comparative example 4.

FIG. 20C is a graph showing electric characteristics measured in the experimental example 4-1 and the comparative example 4. FIG. 20D is a graph showing electric characteristics measured in the experimental example 4-2 and the comparative example 4. In FIGS. 20C and 20D, the x axis represents the gate voltage and the y axis represents the drain current. Hereinafter, the graphs of FIGS. 20C and 20D will be described with reference to FIG. 17B.

Referring to FIGS. 20C and 20D, the organic semiconductor device of the comparative example 4 (c4) did not exhibit an on-off property. In the comparative example 4 (c4), the preliminary organic semiconductor layer 301 was used as a channel layer. The first reactive groups X of the organometallic precursor 331 may be provided in the preliminary organic semiconductor layer 301, as shown in FIG. 12B, and thus, the preliminary organic semiconductor layer 301 may not exhibit a semiconductor property, as shown in FIGS. 20C and 20D. Referring to FIG. 20C, the organic semiconductor device of the experimental example 4-1 (e41) exhibited an on-off property. Referring to FIG. 20D, the organic semiconductor device of the experimental example 4-2 (e42) exhibited an on-off property. In the experimental example 4-1 and 4-2 (e41 and e42), the second organic semiconductor layer 401 was used as a channel layer. As shown in FIG. 17B, the second organic semiconductor layer 401 may include the composites 420, and the composites 420 may be formed by bonding between the first reactive groups X of the organometallic precursor 331 and the self-assembly precursor 410. Thus, the first reactive groups X may not remain in the second organic semiconductor layer 401, and thus, the second organic semiconductor layer 401 may exhibit a semiconductor property, as shown in FIGS. 20C and 20D.

While example embodiments of the inventive concepts have been particularly shown and described, it will be understood by one of ordinary skill in the art that variations in form and detail may be made therein without departing from the spirit and scope of the attached claims

The invention claimed is:

1. A method of manufacturing an organic semiconductor device, the method comprising:
forming a first organic semiconductor layer on a substrate, the first organic semiconductor layer having a reactive group on a top surface of the first organic semiconductor layer; and
forming a self-assembled monolayer by providing a self-assembly precursor onto the first organic semiconductor layer,
wherein the forming of the first organic semiconductor layer comprises applying an organic semiconductor solution to a top surface of the substrate,
wherein the organic semiconductor solution comprises an organic semiconductor material and an organometallic precursor,
wherein the organometallic precursor includes a plurality of organometallic precursors,
wherein the forming of the first organic semiconductor layer further comprises reacting the organometallic precursors with each other to form a network structure, and
wherein the forming of the self-assembled monolayer comprises forming a chemical bond between the self-assembly precursor and the reactive group of the first organic semiconductor layer.

2. The method of claim 1, wherein the self-assembled monolayer has a functional group on a top surface of the self-assembled monolayer, and wherein the functional group of the self-assembled monolayer is different from the reactive group of the first organic semiconductor layer.

3. The method of claim 1, wherein the organometallic precursor is represented by the following chemical formula 1,

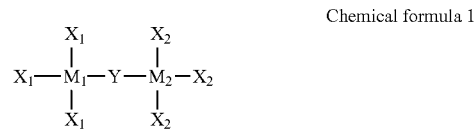

Chemical formula 1 wherein
"$M_1$" and "$M_2$" each independently include at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, or Uub,
"Y" is one of a substituted or unsubstituted C1 to C30 alkyl group, a C3 to C30 cyclo alkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a silyl group,
"$X_1$" and "$X_2$" are each independently selected from the group consisting of hydrogen, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group, and
the substituted alkyl group includes an alkyl group substituted with a halogen element.

4. The method of claim 3, further comprising:
forming an insulating layer between the substrate and the first organic semiconductor layer,
wherein the insulating layer has a functional group on a top surface of the insulating layer, and
wherein the forming of the first organic semiconductor layer further comprises: bonding the organometallic precursor to the functional group of the insulating layer.

5. The method of claim 4, further comprising:
forming a gate pattern between the substrate and the insulating layer; and
forming a source/drain pattern on the first organic semiconductor layer.

6. The method of claim 1, further comprising:
forming an insulating layer on the self-assembled monolayer;
forming a gate pattern on the insulating layer; and
forming a source/drain pattern between the substrate and the first organic semiconductor layer.

7. The method of claim 1, wherein the self-assembly precursor is represented by the following chemical formula 2,

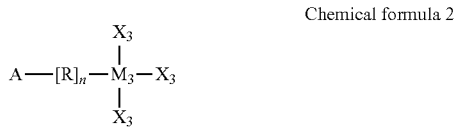

Chemical formula 2 wherein

"A" includes one of —$NH_2$, —SH, —COOH, —$CF_3$, and a halogen element, wherein the halogen element includes one of F, Cl, Br, and I, "R" is one of a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 substituted or unsubstituted aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, a substituted or unsubstituted thiophene, an amino group, and a hydroxy group, "n" is an integral number between 0 and 30, "$M_3$" includes at least one of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Jr, Lr, Rf, Db, Sg, Bh, Hs, Mt, Ds, Rg, or Uub, groups represented by "$X_3$" are each independently selected from the group consisting of hydrogen, a substituted or unsubstituted C1 to C30 alkyl group, a C3 to C30 cycloalkyl group, a C3 to C30 heterocyclic group, a C2 to C30 alkenyl group, a C3 to C30 cycloalkenyl group, a C2 to C30 alkynyl group, a C1 to C30 alkoxy group, a C1 to C30 alkylthio group, a C3 to C30 arylether group, a C3 to C30 arylthioether group, a C3 to C30 aryl group, a C3 to C30 heteroaryl group, a halogen atom, a cyano group, a formyl group, a C1 to C30 alkylcarbonyl group, a C3 to C30 arylcarbonyl group, a carboxyl group, a C1 to C30 alkoxycarbonyl group, a C3 to C30 aryloxycarbonyl group, a C1 to C30 alkylcarbonyloxy group, a C1 to C30 arylcarbonyloxy group, a carbamoyl group, an amino group, and a hydroxy group, and the substituted alkyl group of "$X_3$" includes an alkyl group substituted with a halogen element.

8. The method of claim 1, wherein the chemical bond includes a silanol bond.

* * * * *